(12) United States Patent
Yamazaki et al.

(10) Patent No.: US 7,473,622 B2
(45) Date of Patent: Jan. 6, 2009

(54) LASER ANNEALING METHOD AND MANUFACTURING METHOD OF A SEMICONDUCTOR DEVICE

(75) Inventors: Shunpei Yamazaki, Setagaya (JP); Hisashi Ohtani, Atsugi (JP); Koichiro Tanaka, Atsugi (JP); Kenji Kasahara, Atsugi (JP); Ritsuko Kawasaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/707,094

(22) Filed: Feb. 16, 2007

(65) Prior Publication Data

US 2007/0148925 A1   Jun. 28, 2007

Related U.S. Application Data

(62) Division of application No. 10/871,380, filed on Jun. 21, 2004, now Pat. No. 7,179,698, which is a division of application No. 09/932,935, filed on Aug. 21, 2001, now Pat. No. 6,753,212, which is a division of application No. 09/635,422, filed on Aug. 10, 2000, now Pat. No. 6,730,550.

(30) Foreign Application Priority Data

Aug. 13, 1999 (JP) ............... 11-229518
Sep. 3, 1999 (JP) ............... 11-250940

(51) Int. Cl.
*H01L 21/20* (2006.01)
(52) U.S. Cl. .............. 438/487; 438/795; 438/904; 257/E21.328; 117/44

(58) Field of Classification Search .......... 438/795, 438/487, 488, 799, 914, 904, 211; 117/37, 117/44, 47, 46; 257/E21.328, E21.331, E21.347, 257/E21.349

See application file for complete search history.

(56) References Cited

U.S. PATENT DOCUMENTS 4,343,829 A   8/1982   Tochikubo et al.

(Continued)

FOREIGN PATENT DOCUMENTS

CN   1131340   9/1996

(Continued)

OTHER PUBLICATIONS

Specification and Drawings for U.S. Appl. No. 09/610,637, "Laser Irradiation Apparatus, Laser Irradiation Method, Semiconductor Device, and Method of Manufacturing a Semiconductor Device."

(Continued)

*Primary Examiner*—Caridad M Everhart
(74) *Attorney, Agent, or Firm*—Eric J. Robinson; Robinson Intellectual Property Law Office, P.C.

(57) ABSTRACT

To provide a laser apparatus and a laser annealing method with which a crystalline semiconductor film with a larger crystal grain size is obtained and which are low in their running cost. A solid state laser easy to maintenance and high in durability is used as a laser, and laser light emitted therefrom is linearized to increase the throughput and to reduce the production cost as a whole. Further, both the front side and the back side of an amorphous semiconductor film is irradiated with such laser light to obtain the crystalline semiconductor film with a larger crystal grain size.

36 Claims, 18 Drawing Sheets

U.S. PATENT DOCUMENTS

| | | | |
|---|---|---|---|
| 4,345,967 A * | 8/1982 | Cook | 438/121 |
| 4,599,133 A | 7/1986 | Miyao et al. | |
| 4,609,407 A | 9/1986 | Masao et al. | |
| 5,365,875 A * | 11/1994 | Asai et al. | 438/487 |
| 5,372,089 A | 12/1994 | Yoshida et al. | |
| 5,382,548 A * | 1/1995 | Lee | 438/487 |
| 5,432,122 A | 7/1995 | Chae | |
| 5,436,920 A | 7/1995 | Minemoto et al. | |
| 5,543,352 A | 8/1996 | Ohtani et al. | |
| 5,561,081 A | 10/1996 | Takenouchi et al. | |
| 5,574,740 A | 11/1996 | Hargis et al. | |
| 5,589,233 A | 12/1996 | Law et al. | |
| 5,612,250 A | 3/1997 | Ohtani et al. | |
| 5,612,251 A | 3/1997 | Lee | |
| 5,643,801 A | 7/1997 | Ishihara et al. | |
| 5,733,641 A | 3/1998 | Fork et al. | |
| 5,739,549 A | 4/1998 | Takemura et al. | |
| 5,766,989 A | 6/1998 | Maegawa et al. | |
| 5,803,965 A | 9/1998 | Yoon | |
| 5,817,550 A | 10/1998 | Carey et al. | |
| 5,834,071 A * | 11/1998 | Lin | 427/578 |
| 5,882,960 A | 3/1999 | Zhang et al. | |
| 5,891,764 A | 4/1999 | Ishihara et al. | |
| 5,891,766 A | 4/1999 | Yamazaki et al. | |
| 5,895,933 A | 4/1999 | Zhang et al. | |
| 5,897,799 A | 4/1999 | Yamazaki et al. | |
| 5,900,980 A | 5/1999 | Yamazaki et al. | |
| 5,953,597 A | 9/1999 | Kusumoto et al. | |
| 5,959,779 A | 9/1999 | Yamazaki et al. | |
| 5,968,383 A | 10/1999 | Yamazaki et al. | |
| 5,972,742 A | 10/1999 | Zhang et al. | |
| 5,977,559 A | 11/1999 | Zhang et al. | |
| 5,998,759 A | 12/1999 | Smart | |
| 6,002,101 A | 12/1999 | Yamazaki et al. | |
| 6,002,523 A | 12/1999 | Tanaka | |
| 6,020,224 A * | 2/2000 | Shimogaichi et al. | 438/158 |
| 6,038,075 A | 3/2000 | Yamazaki et al. | |
| 6,051,453 A | 4/2000 | Takemura | |
| 6,054,739 A | 4/2000 | Yamazaki et al. | |
| 6,088,379 A | 7/2000 | Owa et al. | |
| 6,160,269 A | 12/2000 | Takemura et al. | |
| 6,201,261 B1 * | 3/2001 | Sopori | 257/72 |
| 6,204,099 B1 | 3/2001 | Kusumoto et al. | |
| 6,265,745 B1 | 7/2001 | Kusumoto et al. | |
| 6,300,659 B1 | 10/2001 | Zhang et al. | |
| 6,410,374 B1 | 6/2002 | Yamazaki | |
| 6,455,347 B1 | 9/2002 | Hiraishi et al. | |
| 6,455,359 B1 | 9/2002 | Yamazaki et al. | |
| 6,599,790 B1 | 7/2003 | Yamazaki et al. | |
| 6,650,480 B2 | 11/2003 | Tanaka | |
| 6,709,905 B2 | 3/2004 | Kusumoto et al. | |
| 6,737,672 B2 | 5/2004 | Hara et al. | |
| 6,753,212 B2 | 6/2004 | Yamazaki et al. | |
| 6,828,584 B2 | 12/2004 | Arao et al. | |
| 6,835,675 B2 | 12/2004 | Yamazaki et al. | |
| 6,856,630 B2 | 2/2005 | Tanaka | |
| 6,921,686 B2 | 7/2005 | Kusumoto et al. | |
| 6,924,594 B2 | 8/2005 | Ogura et al. | |
| 6,974,731 B2 | 12/2005 | Yamazaki et al. | |
| 7,045,403 B2 | 5/2006 | Kusumoto et al. | |

FOREIGN PATENT DOCUMENTS

| | | |
|---|---|---|
| CN | 1131341 | 9/1996 |
| JP | 56-064480 | 6/1981 |
| JP | 02299222 | * 12/1990 |
| JP | 03-062971 | 3/1991 |
| JP | 05-082466 | 4/1993 |
| JP | 06-291034 | 10/1994 |
| JP | 07-131034 | 5/1995 |
| JP | 07-161634 | 6/1995 |
| JP | 07-321339 | 12/1995 |
| JP | 08-051077 | 2/1996 |
| JP | 08-213633 | 8/1996 |
| JP | 08-228006 | 9/1996 |
| JP | 09-260676 | 10/1997 |
| JP | 10-062355 | 3/1998 |
| JP | 10-064842 | 3/1998 |

OTHER PUBLICATIONS

Helen et al., "Reproducible High Field Effect Mobility Polysilicon Thin Film Transistors Involving Pulsed Nd:YVO$_4$ Laser Crystallization," pp. 297-300, 1999, IEDM 0-7803-5410-9/99 IEEE.

Office Action dated Apr. 8, 2005 from Patent Office of the People's Republic of China, for Application No. 00122783.1.

R. Dassow, et al., "Laser-Crystallized Polycrystalline Silicon on Glass for Photovoltaic Applications," Solid State Phenomena, Apr. 1999, vol. 67-8, pp. 193-197.

Helen et al., "Reproducible High Field Effect Mobility Polysilicon Thin Film Transistors Involving Pulsed Nd:YVO$_4$ Laser Crystallization," p. 943, 1999, IEDM 0-7803-5410-9/99 IEEE.

Office Action (Application No. 200510099847.0) dated May 11, 2007.

* cited by examiner

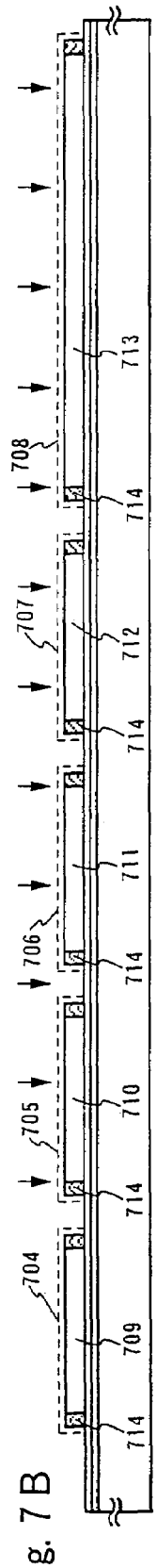
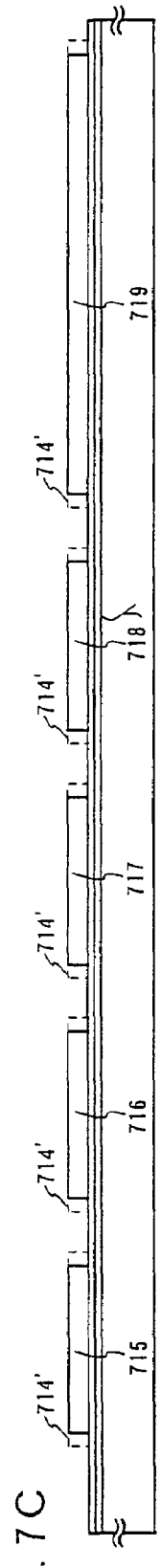
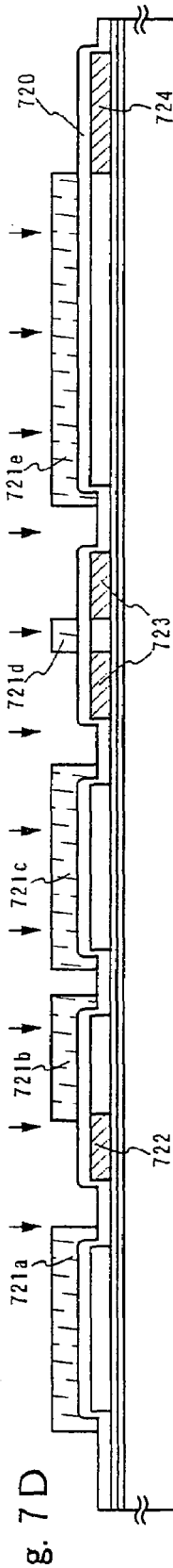
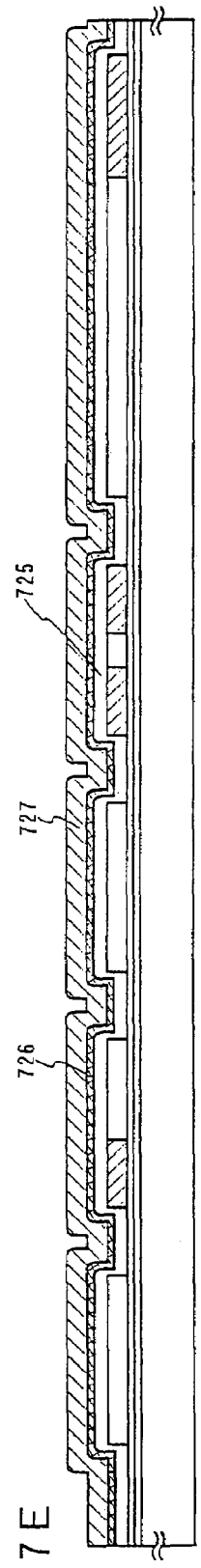

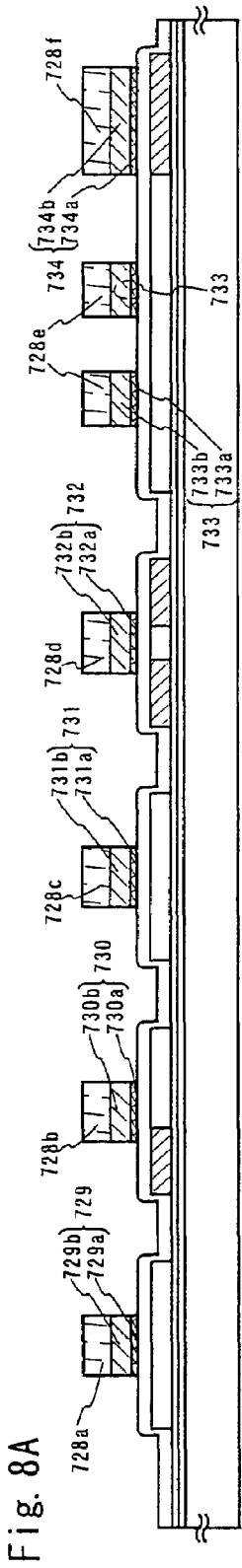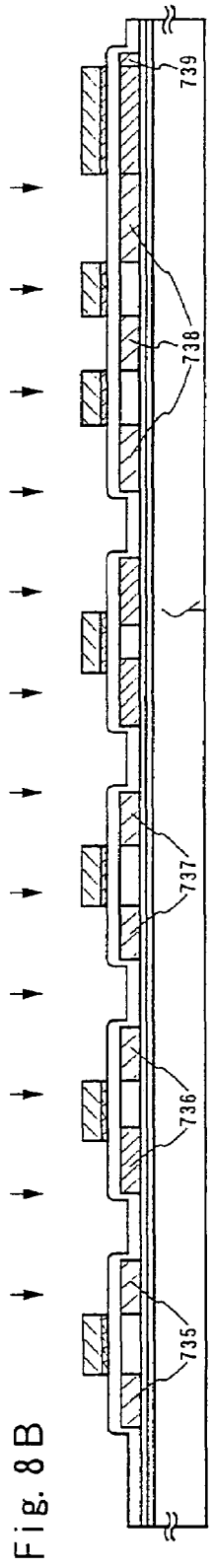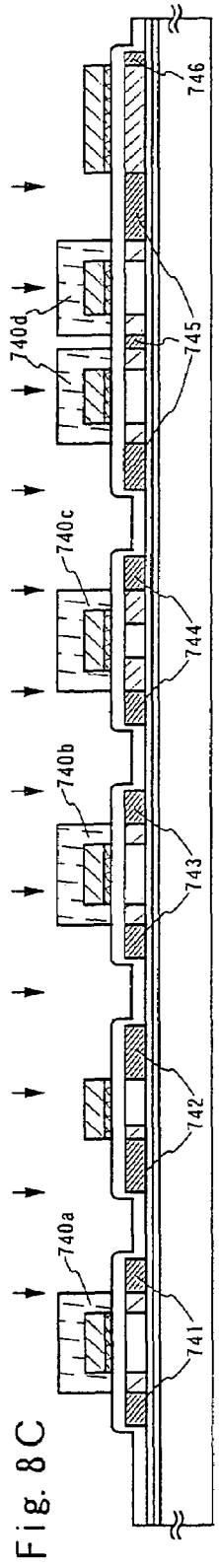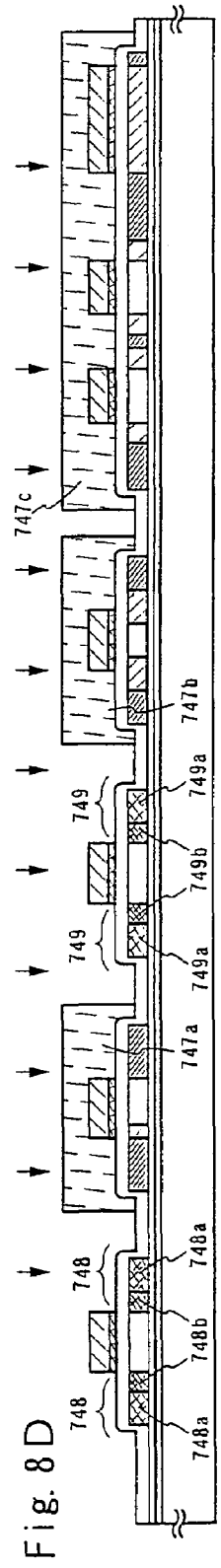

LASER ANNEALING METHOD AND MANUFACTURING METHOD OF A SEMICONDUCTOR DEVICE

BACKGROUND OF THE INVENTION

1. Field of the Invention

The present invention relates to a method of annealing a semiconductor film with the use of laser light (hereinafter referred to as laser annealing) and to a laser apparatus for performing the laser annealing (an apparatus including a laser and an optical system for leading laser light output from the laser to a process object). The invention also relates to a semiconductor device fabricated by a manufacturing process that comprises the laser annealing step, and to the manufacturing process. The semiconductor device here includes an electro-optical device such as a liquid crystal display device and an EL display device, and an electronic device having the electro-optical device as one of its components.

2. Description of the Related Art

An advance has been made in recent years in development of thin film transistors (hereinafter referred to as TFTs), and TFTs using polycrystalline silicon films (polysilicon films) as crystalline semiconductor films are receiving the attention. In liquid crystal display devices (liquid crystal displays) and EL (electroluminescence) display devices (EL displays), in particular, such TFTs are used as elements for switching pixels and elements for forming driver circuits to control the pixels.

General means for obtaining a polysilicon film is a technique in which an amorphous silicon film is crystallized into a polysilicon film. A method in which an amorphous silicon film is crystallized with the use of laser light has lately become the one that is especially notable. In this specification, to crystallize an amorphous semiconductor film with laser light to obtain a crystalline semiconductor film is called laser crystallization.

The laser crystallization is capable of instantaneous heating of semiconductor film, and hence is an effective technique as measures for annealing a semiconductor film formed on a low heat resistant substrate such as a glass substrate or a plastic substrate. In addition, the laser annealing makes the throughput definitely higher as compared with conventional heating measures using an electric furnace (hereinafter referred to as furnace annealing).

There are various kinds of laser light, of which the general one to be used in laser crystallization is laser light generated and emitted from a pulse oscillation type excimer laser as a source (hereinafter referred to as excimer laser light). The excimer laser has advantages in that it is large in output and that it is capable of repetitive irradiation at a high frequency and, moreover, excimer laser light is advantageous in terms of its high absorption coefficient with respect to silicon films.

To generate excimer laser light, KrF (wavelength, 248 nm) or XeCl (wavelength, 308 nm) is used as an excitation gas. However, Kr (krypton) gas and Xe (xenon) gas are very expensive, causing a problem of increase in production cost when recharge of the -as is frequent.

In addition, every two or three years, excimer laser annealing requires replacement of attachments such as a laser tube for laser oscillation and a gas refinery for removing unnecessary compounds that are produced during the course of oscillation. Many of these attachments are also expensive, taking part in increasing the production cost.

As seen in the above, a laser apparatus using excimer laser light does possess high ability but also possess drawbacks in that maintenance thereof is very troublesome and that the running cost (which means the costs required for operating the apparatus) is high for a laser apparatus for mass production.

SUMMARY OF THE INVENTION

The present invention has been made in view of the above, and an object of the present invention is therefore to provide a laser apparatus which is capable of providing a crystalline semiconductor film with a larger crystal grain size than in prior art and which is low in running cost, and to provide a laser annealing method using that laser apparatus. Another aspect of the present invention is to provide a semiconductor device fabricated by using the laser annealing method and a method of manufacturing the semiconductor device.

The present invention is characterized in that the front side and the back side of a semiconductor film are irradiated with laser light generated and emitted from a solid state laser (a laser that outputs laser light using a crystal rod as a resonance cavity) as a source.

When the semiconductor film is irradiated, the laser light is preferably linearized by an optical system. To linearize laser light indicates that laser is formed into such a shape as to make the irradiated area linear when a process object is irradiated with the laser light. In short, it indicates that the sectional shape of the laser light is linearized. The term "linear" here does not mean a line in the strict sense of the word, but means a rectangle (or an oblong) with a large aspect ratio. For instance, a rectangle or an oblong having an aspect ratio of 10 or more (preferably 100 to 10000).

In the above construction, the solid state laser may be generally known ones such as a YAG laser (which usually indicates an Nd:YAG laser), an Nd:YVO$_4$ laser, an Nd:YAlO$_3$ laser, a ruby laser, a Ti:sapphire laser, or a glass laser. The YAG laser is particularly preferable because of its superiority in coherence and pulse energy. There are a continuous wave YAG laser and a pulse oscillation type YAG laser and the latter is desirable in the present invention, for it is capable of large area irradiation.

However, the fundamental wave (a first harmonic) of the YAG laser has as high wavelength as 1064 nm. It is therefore preferable to use second harmonic (wavelength, 532 nm), third harmonic (wavelength, 355 nm), or fourth harmonic (wavelength, 266 nm).

In particular, the second harmonic of the YAG laser has a frequency of 532 nm and is within a wavelength range (around 530 nm) in which reflection at an amorphous silicon film is the least when the amorphous silicon film is irradiated with the second YAG laser wave. In this wavelength range, in addition, the quantity of transmittable laser light through the amorphous semiconductor film is enough to efficiently irradiate again the amorphous semiconductor film from its back side using a reflective member. Moreover, the laser energy of the second harmonic is large, about 1.5 J/pulse at a maximum (in an existing pulse oscillation type YAG laser apparatus). When it is linearized, the length thereof in the longitudinal direction is therefore markedly lengthened to make it possible to irradiate a large area at once with laser light. These harmonics can be obtained by using a non-linear crystal.

The fundamental wave can be modulated into the second harmonic, the third harmonic, or the fourth harmonic by a wavelength modulator that includes a non-linear element. The respective harmonics may be formed by following any known technique. In this specification, "laser light generated and emitted from a solid state laser as a source" includes not only the fundamental wave but also the second harmonic, the third harmonic, and the fourth harmonic which are obtained by modulating the wavelength of the fundamental wave.

Alternatively, the Q switch method (Q modulation switch method) that is often used in the YAG laser may be employed. This method is to sufficiently lower the Q value of a laser resonator in advance and to then rapidly raise the Q value, to thereby output sharp pulse laser having a very high energy value. The method is one of known techniques.

The solid state laser used in the present invention can output laser light as long as a solid crystal, a resonant mirror, and a light source for exciting the solid crystal are satisfied, basically. Therefore, maintenance thereof is not laborious unlike the excimer laser. In other words, the running cost of the solid state laser is significantly less as compared with the excimer laser, making it possible to greatly reduce the production cost of a semiconductor device. A decrease in number of the maintenance leads to an increase of the operating rate of the mass-production line, so that the throughput along the manufacturing steps is improved as a whole. This also contributes considerably to the reduction in production cost of the semiconductor device. Moreover, the solid state laser occupies a smaller area than the excimer laser does, which is advantageous in designing a production line.

In addition, to perform laser annealing by irradiating the front side and the back side of an amorphous semiconductor film with laser light allows obtainment of a crystalline semiconductor film with a larger crystal grain size than in prior art (where the amorphous semiconductor film is irradiated with laser light only from its front side). According to the applicant of the present invention, it is considered that irradiation of laser light onto the front side and the back side of an amorphous semiconductor film slows down the cycle of fusion and solidification of the semiconductor film, and that the crystal grain size is increased as a result.

The obtainment of a crystalline semiconductor film with a large crystal grain size leads to a considerable improvement of the performance of the semiconductor device. Taking a TFT as an example, enlargement of a crystal grain size allows reduction in number of crystal grain boundaries that may be contained in a channel formation region. That is, it allows fabricating a TFT that has one, preferably zero, crystal grain boundary in its channel formation region. Since the crystallinity of each crystal grain is such that it may substantially be regarded as a single crystal, to obtain a mobility (electric field effect mobility) equal to or higher than that of a transistor using a single crystal semiconductor is also possible.

Further, carriers cross the crystal grain boundaries extremely less frequently in the present invention to thereby reduce the fluctuation of ON current values (drain current when a TFT is in ON state), OFF current values (drain current when a TFT is in OFF state), threshold voltage, of S values, and electric field effect mobility.

BRIEF DESCRIPTION OF THE DRAWINGS

In the accompanying drawings:

FIGS. 7A to 7E are diagrams showing a process of manufacturing an active matrix substrate;

FIGS. 8A to 8D are diagrams showing a process of manufacturing an active matrix substrate;

DETAILED DESCRIPTION OF THE PREFERRED EMBODIMENTS

Embodiment Mode 1

Figure 1A:
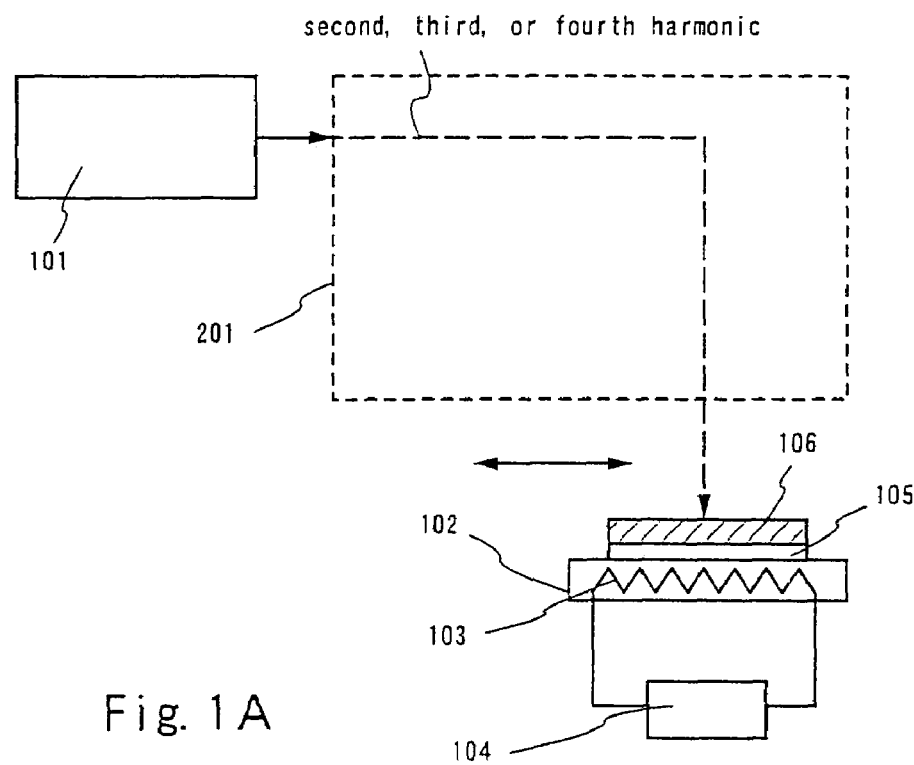
FIGS. 1A and 1B are diagrams showing the structure of a laser apparatus.

An embodiment mode of the present invention will be described. FIG. 1A is a diagram showing the structure of an laser apparatus including a laser of the present invention. This laser apparatus has an Nd: YAG laser 101, an optical system 201 for linearizing laser light (preferably second harmonic, third harmonic, or fourth harmonic) generated and emitted from an Nd:YAG laser 101, and a stage 102 on which a light transmittable substrate is fixed. The stage 102 is provided with a heater 103 and a heater controller 104 to heat the substrate up to a temperature of 100 to 450° C. A reflective member 105 is provided on the stage 102, and placed on the reflective member 105 is a substrate 106 on which an amorphous semiconductor film is formed.

If the laser light output from the Nd:YAG laser 101 is modulated into any of the second to fourth harmonics, a wavelength modulator including a non-linear element is set right behind the Nd:YAG laser 101.

Figure 1B:
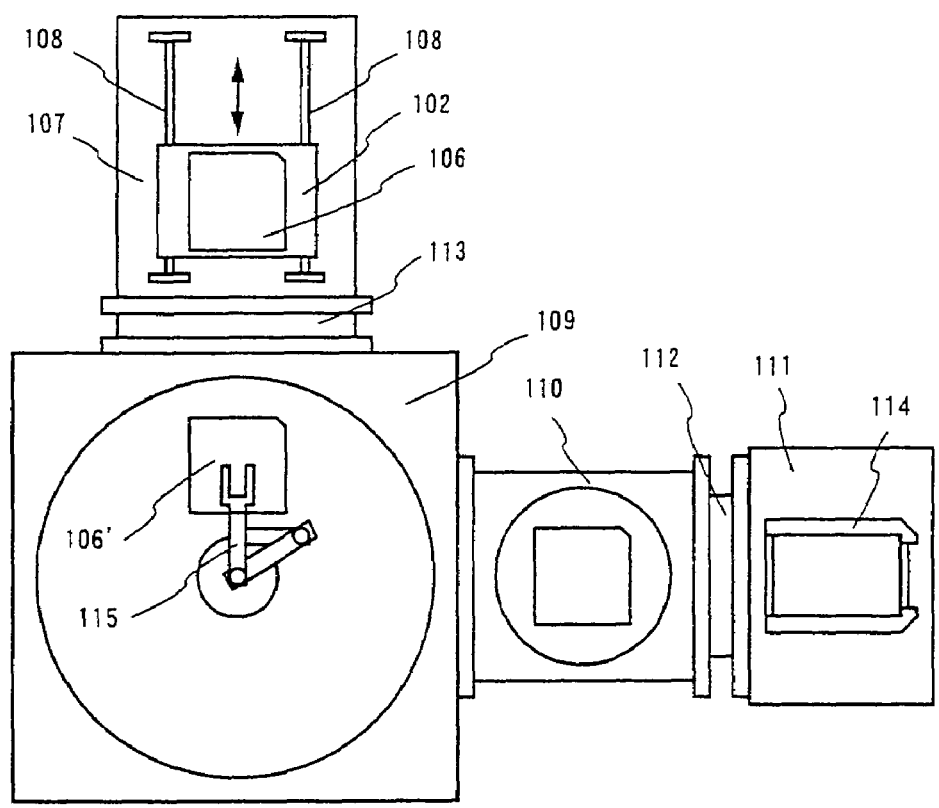

Next will be described, with reference to Fig. 1B, how to hold the substrate 106 in the laser apparatus having the structure as shown in FIG. 1A. The substrate 106 held by the stage 102 is set in a-reaction chamber 107, and irradiated with linear laser light generated and emitted from the laser 101 as a source. The inside of the reaction chamber may be decompressed by an exhaust system (not shown), or may have an inert gas atmosphere by using a gas system (not shown), so that the semiconductor film can be heated up to a temperature of 100 to 450° C. without contaminating the film.

The stage 102 can be moved along a guide rail 108 within the reaction chamber, making it possible to irradiate the entire surface of the substrate with laser light. The laser light enters from a not-shown window that is formed from quarts on the top surface of the substrate 106. In FIG. 1B, a transfer chamber 109, an intermediate chamber 110, and a loading/unloading chamber 111 are connected to the reaction chamber 107, and these chambers are separated from each other by gate valves 112, 113.

A cassette 114 that is capable of holding a plurality of substrates is placed in the loading/unloading chamber 111. The substrates are transported by a transporting robot 115 that is installed in the transfer chamber 109. Reference symbol 106' denotes a substrate in the transportation. With such a structure, successive laser annealing can be carried out under reduced pressure or in an inert gas atmosphere.

Figure 2A:
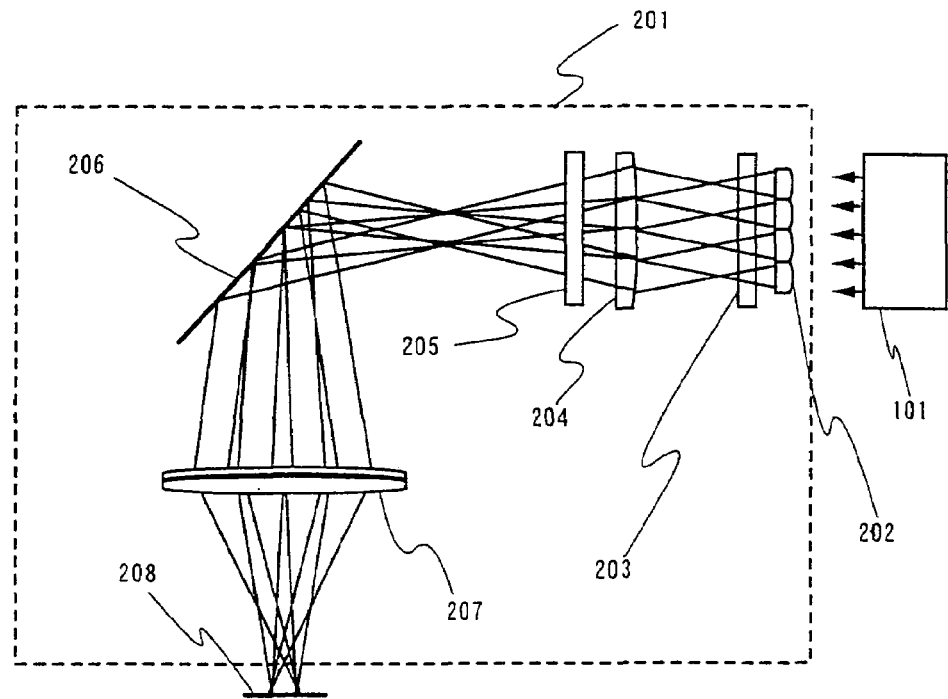
FIGS. 2A and 2B are diagrams showing the structure of an optical system of a laser apparatus.
Figure 2B:
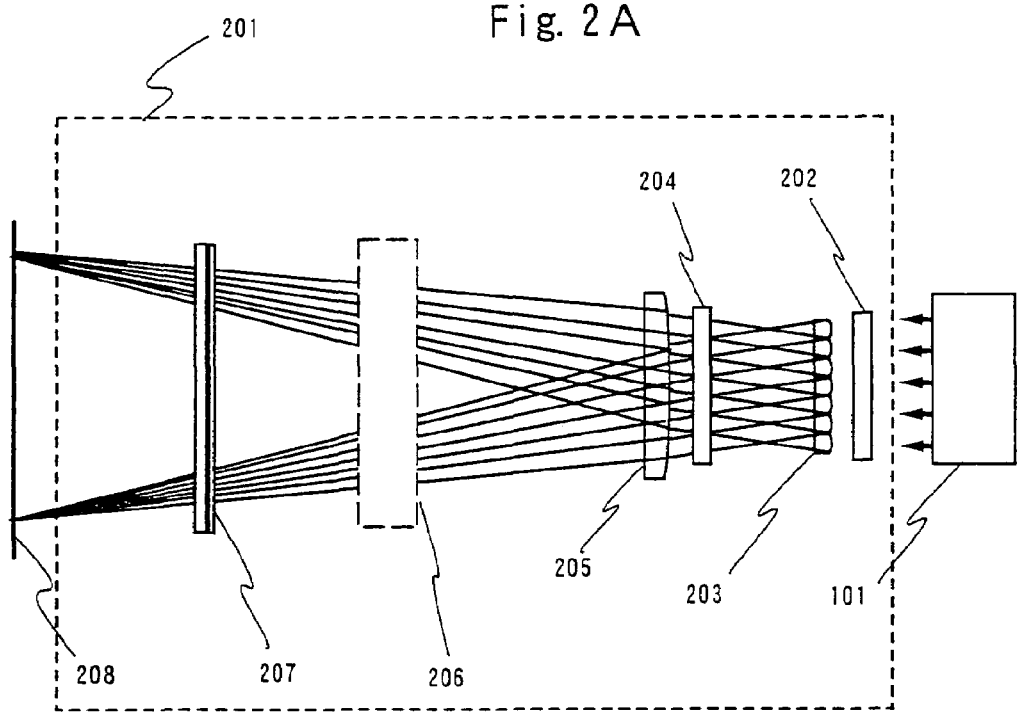

Next, the structure of the optical system 201 for linearizing laser light will be described with reference to FIGS. 2A and 2B. FIG. 2A is a view of the optical system 201 viewed from its side, and FIG. 2B is a view of the optical system 201 viewed from its top.

The laser light generated and emitted from the laser 101 as a source is split longitudinally by a cylindrical lens array 202. The split laser light is further split laterally by a cylindrical lens array 203. That is, ultimately, the laser light is split by the cylindrical lens arrays 202, 203 into matrix.

Then the laser light is condensed once by a cylindrical lens 204. The laser light passes through a cylindrical lens 205 right after the cylindrical lens 204. Thereafter, the laser light is reflected at a mirror 206, passes through a cylindrical lens 207, and then reaches an irradiated area 208.

At this point, the laser light projected onto the irradiated area 208 is linear. This means that the sectional shape of the laser light transmitted through the cylindrical lens 207 is linear. The linearized laser light is homogenized in its width direction (shorter one) by the cylindrical lens array 202, the cylindrical lens 204, and the cylindrical lens 207. On the other hand, the linearized laser light is homogenized in its length direction (longer one) by the cylindrical lens array 203 and the cylindrical lens 205.

Figure 3:
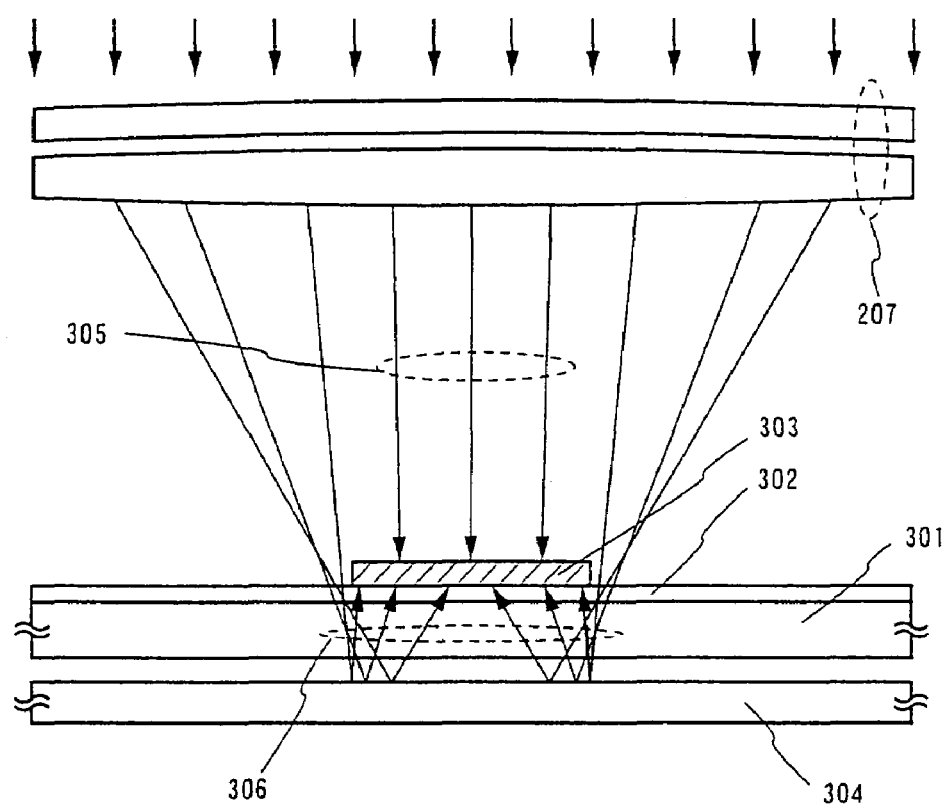
FIG. 3 is a diagram illustrating a laser annealing method of the present invention.

A description given next with reference to FIG. 3 is about an arrangement for irradiating the process film formed on the substrate from its front and back with the laser light. FIG. 3 is a diagram showing the positional relation between the substrate 106 and the reflective member 105 in FIG. 1A.

In FIG. 3, reference symbol 301 denotes a light transmittable substrate, the front side (the side where a thin film or an element is to be formed) of which has an insulating film 302 and an amorphous semiconductor film (or a microcrystal semiconductor film) 303 formed thereon. A reflective member 304 for reflecting laser light is arranged beneath the light transmittable substrate 301.

The light transmittable substrate 301 may be a glass substrate, a quartz substrate, a crystallized glass substrate or a plastic substrate. For the insulating film 302, an insulating film containing silicon, such as a silicon oxide film or a silicon oxide nitride film (SiOxNy) film, may be used. Prospective films for the amorphous semiconductor film 303 include an amorphous silicon film, an amorphous silicon germanium film, etc.

A metal film formed on a surface (where the laser light is to be reflected) of a substrate may be used as the reflective member 304. Alternatively, a substrate formed of a metal element may serve as the reflective member 304. In that case, any material may be used for the metal film. Typically used is a metal film containing any element chosen out of aluminum, silver, tungsten, titanium, and tantalum.

It is also possible to directly form a metal film as above on the back side of the substrate 301, instead of arranging the reflective member 304, so that the laser light is reflected at the metal film. Note that this structure is possible only when the metal film formed on the back side is not removed during the manufacture of a semiconductor device.

The amorphous semiconductor film 303 is then irradiated with the laser light that has been linearized through the optical system 201 (only the cylindrical lens 207 is shown in the drawing) illustrated in FIGS. 2A and 2B.

At this point, the amorphous semiconductor film 303 is irradiated with two beams of laser light, i.e., laser light 305 that passes through the cylindrical lens 207 to directly irradiate the film, and laser light 306 that is reflected at the reflective member 304 before it irradiates the amorphous semiconductor film 303. In this specification, the laser light used to irradiate the front side of the amorphous semiconductor film is called a primary laser light while the laser light used to irradiate the back side thereof is called a secondary laser light.

The laser light passes through the cylindrical lens 207 to have an angle of incident of 45 to 90° with respect to the front side of the substrate during the process of being condensed. For that reason, the secondary laser light 306 is the light that reaches further to the back side of the amorphous semiconductor film 303 so as to irradiate there. The secondary laser light 306 may be obtained more efficiently by forming an uneven portion on the reflective surface of the reflective member 304 to diffuse the laser light.

In particular, the second harmonic of the YAG laser has a frequency of 532 nm and is within a wavelength range (around 530 nm) in which reflection at an amorphous semiconductor film is the least when the amorphous semiconductor film is irradiated with the second YAG laser wave. In this wavelength range, in addition, the quantity of transmittable laser light through the amorphous semiconductor film is enough to efficiently irradiate again the amorphous semiconductor film from its back side using the reflective member. Moreover, the laser energy of the second harmonic is large, about 1.5 J/pulse at a maximum (in an existing pulse oscillation type YAG laser apparatus). When it is linearized, the length thereof in the longitudinal direction is therefore markedly lengthened to make it possible to irradiate a large area at once with laser light.

As described above, according to this embodiment mode, the laser light generated and emitted from the solid state laser as a source can be linearized, and the linearized laser light can be split into the primary laser light and the secondary laser light in the optical system so as to be used to irradiate the front side of the amorphous semiconductor film and the back side thereof, respectively.

Embodiment Mode 2

A description given here is a different mode for carrying out the present invention from Embodiment Mode 1. This embodiment mode shows an example in which, without using a reflecting member as described in Embodiment Mode 1, an amorphous semiconductor film is irradiated from its front and back with laser light split into two strains of laser light by some constituent of an optical system.

Figure 4A:
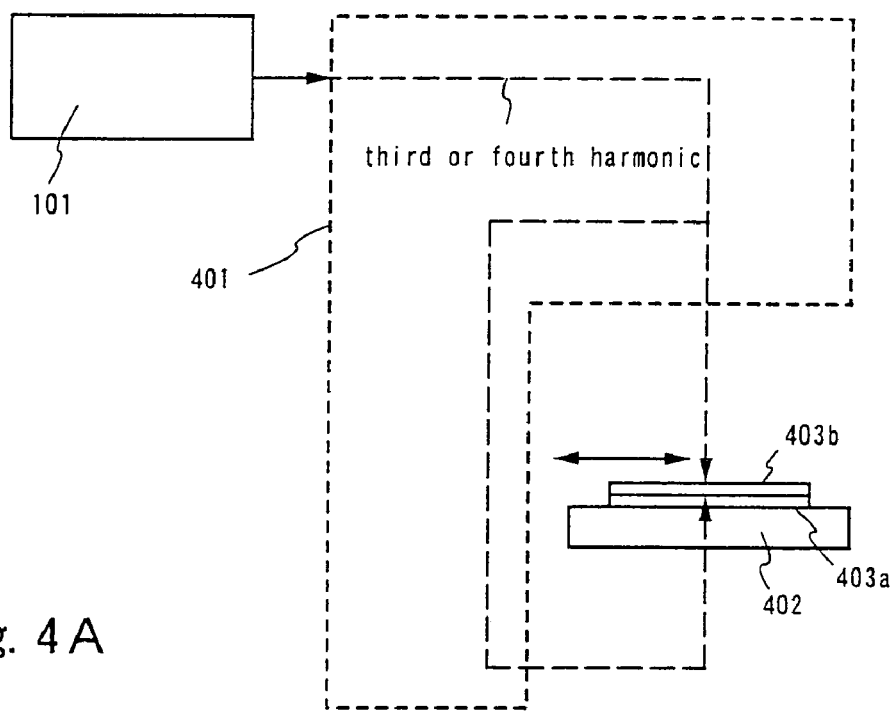
FIGS. 4A and 4B are diagrams showing the structure of a laser apparatus.

FIG. 4A is a diagram showing the structure of a laser apparatus including a laser of this embodiment mode. The structure is basically the same as that of the laser apparatus described in Embodiment Mode 1 with FIGS. 1A and 1B. Accordingly, only parts different from the ones in the precedent mode are given different symbols and are explained.

This laser apparatus has an Nd:YAG laser 101, an optical system 401 for linearizing laser light that is generated and emitted from an Nd:YAG laser 101 and splitting into two strains laser light (preferably third harmonic, or fourth harmonic), and a light transmittable stage 402 on which a light transmittable substrate is fixed. A substrate 403a is set on the stage 402, and an amorphous semiconductor film 403b is formed on the substrate 403a.

If the laser light output from the Nd:YAG laser 101 is modulated into either the third harmonic or the fourth harmonic, a wavelength modulator including a non-linear element is set right behind the Nd:YAG laser 101.

In the case of this embodiment mode, the amorphous semiconductor film 403b is irradiated with laser light that has been transmitted through the stage 402, and hence the stage 402 has to be light transmittable. It is desirable to suppress as much attenuation as possible at the stage 402, because the energy of the laser light irradiated from the stage 402 (a secondary laser light) is expectedly attenuated when the laser light is transmitted through the substrate.

Figure 4B:
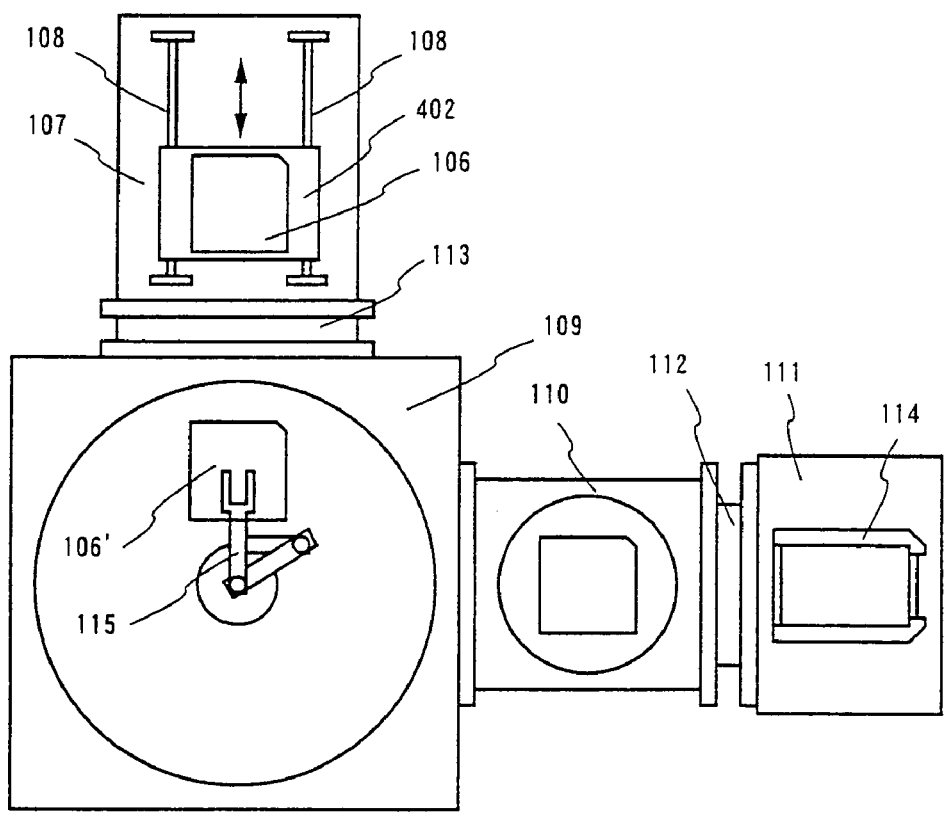

FIG. 4B is a diagram illustrating how to hold the substrate 403a in the laser apparatus shown in FIG. 4A. The explanation thereof is omitted, however, for the arrangement thereof is the same as the one shown in Fig. 1B except that the light transmittable stage 402 is used here.

Figure 5:
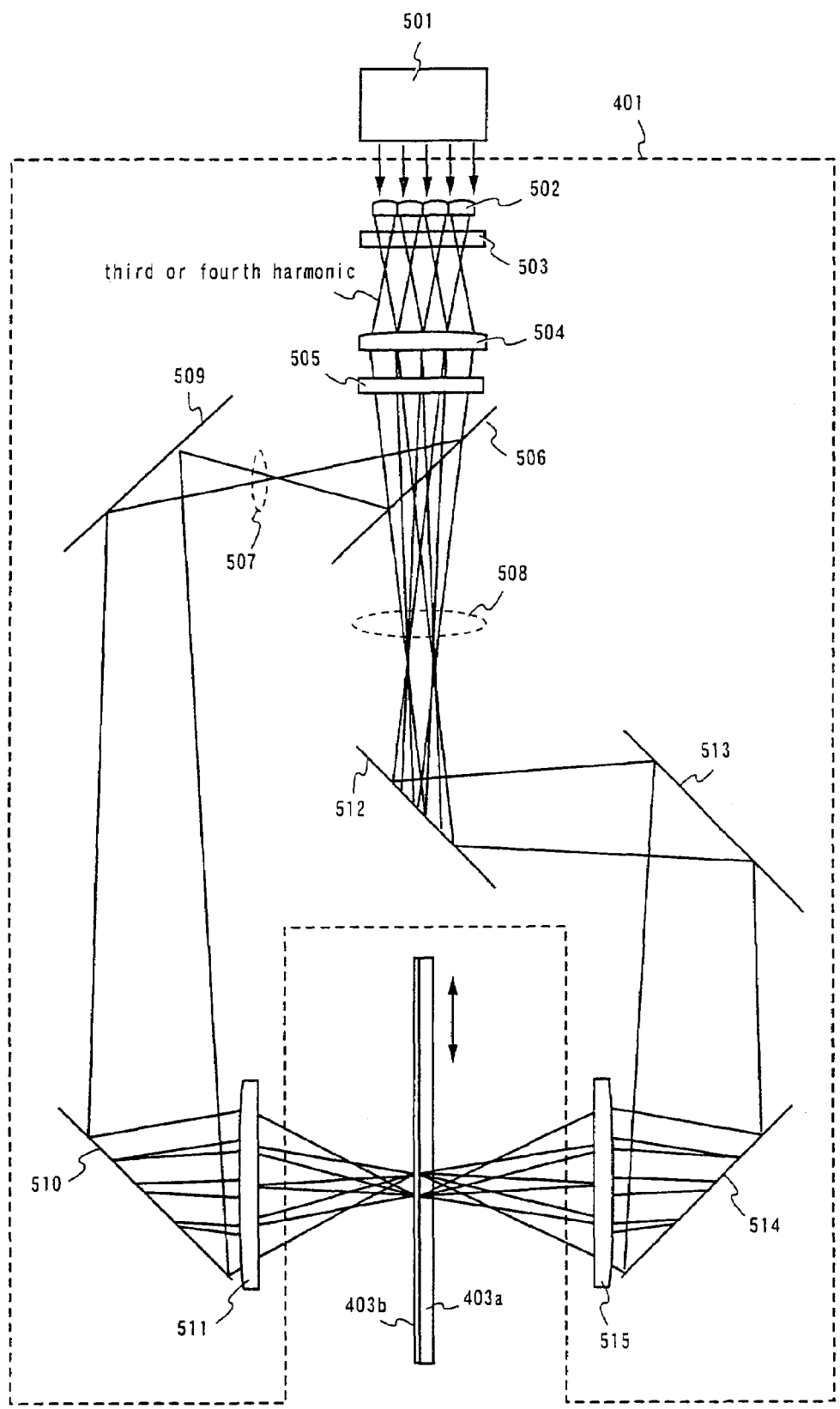
FIG. 5 is a diagram illustrating a laser annealing method of the present invention.

Next, the structure of the optical system 401 shown in FIG. 4A will be described with reference to FIG. 5. FIG. 5 is a view of the optical system 401 viewed from its side. Laser light generated and emitted from an Nd:YAG laser 501 as a source (the third harmonic or the fourth harmonic) is split longitudinally by a cylindrical lens array 502. The split laser light is further split laterally by a cylindrical lens array 503. The laser light is thus split by the cylindrical lens arrays 502, 503 into matrix.

Then the laser light is condensed once by a cylindrical lens 504. The laser light passes through a cylindrical lens 505 right after the cylindrical lens 504. The optical system 401 is the same as the one shown in FIGS. 2A and 2B up through this point.

Thereafter, the laser light enters into a half mirror 506 and is split here into a primary laser light 507 and a secondary laser light 508. The primary laser light 507 is reflected at mirrors 509, 510, passes through a cylindrical lens 511, and then reaches the front side of the amorphous semiconductor film 403b.

The secondary laser light 508 split by the half mirror 506 is reflected at mirrors 512, 513, 514, passes through a cylindrical lens 515, and then transmits through the substrate 403a to reach the back side of the amorphous semiconductor film 403b.

At this point, the laser light projected onto an irradiated area on the substrate is linear as in Embodiment Mode 1. The linearized laser light is homogenized in its width direction (shorter one) by the cylindrical lens array 502, the cylindrical lens 504, and the cylindrical lens 515. On the other hand, the linearized laser light is homogenized in its length direction (longer one) by the cylindrical lens array 503, the cylindrical lens 505, and the cylindrical lens 509.

As described above, according to this embodiment mode, the laser light generated and emitted from the solid state laser as a source can be linearized, and the linearized laser light can be split into the primary laser light and the secondary laser light so as to be used to irradiate the front side of the amorphous semiconductor film and the back side thereof, respectively.

Embodiment Mode 3

A description given here is about an embodiment mode different from Embodiment Mode 2. This embodiment mode shows an example in which laser light is split into two strains of laser light by some constituent of an optical system, the two laser beams are made into a third harmonic and a fourth harmonic, respectively, and laser annealing of an amorphous semiconductor film is carried out by irradiating its front with the fourth harmonic while irradiating its back with the third harmonic.

Figure 6:
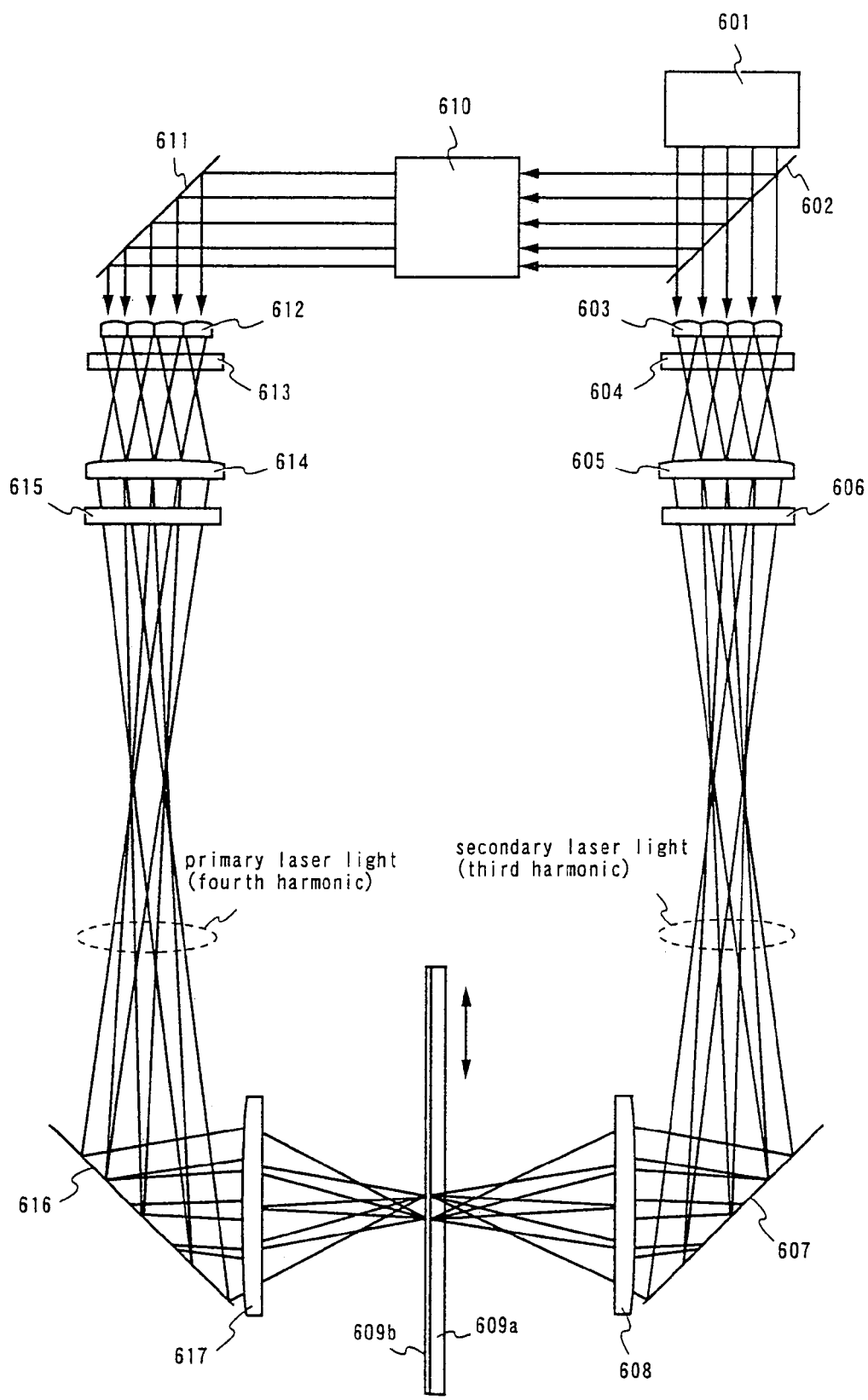
FIG. 6 is a diagram illustrating a laser annealing method of the present invention.

FIG. 6 is a side view of the optical system of a laser apparatus for use in this embodiment mode. The laser light generated and emitted from an Nd:YAG laser 601 as a source is split by a half mirror 602. Note that though not shown, a part of a fundamental wave output from the Nd:YAG laser 601 is modulated into a third harmonic having a wavelength of 355 nm before reaching the half mirror 602.

First, laser light which has transmitted through the half mirror 602 (to serve as a secondary laser light) travels through cylindrical lens arrays 603, 604, cylindrical lenses 605, 606, a mirror 607, a cylindrical lens 608, and a substrate 609a to be used to irradiate the back side of an amorphous semiconductor film 609b.

The laser light used ultimately to irradiate the back side of an amorphous semiconductor film 609b is linearized. The process of linearization is the same as in the explanation of the optical system of FIGS. 2A and 2B, and hence is not described here.

Laser light which has been reflected at the half mirror 602 (to serve as a primary laser light) is modulated into a fourth harmonic having a wavelength of 266 nm by a wavelength modulator 610 that includes a non-linear element. Thereafter, the laser light travels through a mirror 611, cylindrical lens arrays 612, 613, cylindrical lenses 614, 615, a mirror 616, and a cylindrical lens 617 to be used to irradiate the front side of the amorphous semiconductor film 609b.

The laser light used ultimately to irradiate the back side of an amorphous semiconductor film 609b is linearized. The process of linearization is the same as in the explanation of the optical system of FIGS. 2A and 2B, and hence is not described here.

As described above, this embodiment mode is characterized in that the front side of the amorphous semiconductor film is irradiated with the fourth harmonic with a wavelength of 266 nm while the back side of the amorphous semiconductor film is irradiated with the third harmonic with a wavelength of 355 nm. It is preferable to linearize the sectional shape of the third harmonic and the fourth harmonic as in this embodiment mode, for the throughput of the laser annealing is improved.

When the substrate 609a is a glass substrate, light with a wavelength shorter than 250 nm or so does not transmit through the substrate. As for the #1737 substrate with a thickness of 1.1 mm, a product of Corning, Ltd., light with a wavelength of about 240 nm is the first that can transmit the substrate. The substrate allows about 38% of light with a wavelength of 300 nm to transmit therethrough, about 85% if it is 350 nm, and about 90% if it is 400 nm. That is, to use laser light with a wavelength of 350 nm or more (preferably with 400 nm or more wavelength) as the secondary laser light is desirable when a glass substrate is employed for the substrate 609a.

Accordingly, when an Nd:YAG laser is used for a solid state laser and a glass substrate is used for the substrate on which the amorphous semiconductor film is formed as in this embodiment mode, it is desirable to make the primary laser light that does not transmit the substrate into the fourth harmonic and to make the secondary laser light that transmits the substrate into the third harmonic.

As described above, it is effective to adopt a different wavelength of the laser light used to irradiate the front side of the amorphous semiconductor film (the primary laser light)

from a wavelength of the laser light used to irradiate the back side of the amorphous semiconductor film (the secondary laser light), in accordance with the material of the substrate or the film quality of the amorphous semiconductor film.

Although used in this embodiment mode is split laser light which has been generated and emitted from one laser as a source, two lasers that output laser light of different wavelengths may alternatively be used.

Embodiment 1

An embodiment of the present invention is described by using FIGS. 7A to 9C. A method for manufacturing a pixel TFT and a storage capacitor of the pixel section, and an n-channel TFT and a p-channel TF1 of the driver circuit disposed in the periphery of the pixel section, at the same time, is described here.

In FIG. 7A, barium borosilicate glass or aluminoborosilicate glass as typified by Corning #7059 glass and #1737 glass can be used for a substrate 701. Besides these glass substrates, plastic substrates not having optical anisotropy such as polyethylene terephthalate (PET), polyethylene naphthalate (PEN), polyethersulfone (PES), etc, can also be used.

A base film 702 comprising such as a silicon oxide film, a silicon nitride film or a silicon oxynitride film is formed over the surface of the substrate 701, on which TFT is to be formed, in order to prevent the diffusion of impurities from the substrate 701. For example, a laminate of the silicon oxynitride film 702a formed from $SiH_4$, $NH_3$ and $N_2O$ by plasma CVD to a thickness of 10 to 200 nm (preferably, 50 to 100 nm) and a hydrogenated silicon oxynitride film 702b formed similarly from $SiH_4$ and $N_2O$ to a thickness of 50 to 200 nm (preferably, 100 to 150 nm), is formed.

The silicon oxynitride film is formed by using the conventional parallel plate type plasma-enhanced CVD. The silicon oxynitride film 702a is formed by introducing $SiH_4$ at 10 sccm, $NH_3$ at 100 sccm and $N_2O$ at 20 sccm into a reaction chamber under the condition of a substrate temperature of 325° C., a reaction pressure of 40 Pa, a discharge power density of 0.41 W/cm$^2$ and a discharge frequency of 60 MHZ. On the other hand, hydrogenated silicon oxynitride film 702b is formed by introducing $SiH_4$ at 5 sccm, $N_2O$ at 120 sccm and $H_2$ at 125 sccm into a reaction chamber under the condition of the substrate temperature 400° C., a reaction pressure of 20 Pa, a discharge power density of 0.41 W/cm$^2$ and a discharge frequency of 60 MHZ. These films can be formed successively by only changing the substrate temperature and by switching the reactive gases.

Further, the silicon oxynitride film 702a is formed so that its internal stress is a pulling stress when considering the substrate as the center. The silicon oxynitride film 702b is made to have its internal stress in the similar direction but it is made to have a smaller stress in the absolute value, compared with that of the silicon oxynitride film 702a.

Next, an amorphous semiconductor film 703 having a thickness of 25 to 80 nm (preferably, 30 to 60 nm) and an amorphous structure is formed by a known method such as plasma CVD or sputtering. For example, an amorphous silicon film is formed to a thickness of 55 nm by plasma CVD. Both the base film 702 and the amorphous semiconductor film 703 can be formed continuously. For example, after the silicon oxynitride film 702a and the hydrogenated silicon oxynitride film 702b are formed continuously by the plasma CVD as described above, the deposition can be carried out continuously by switching the reactive gases from $SiH_4$, $N_2O$ and $H_2$ to $SiH_4$ and $H_2$, or $SiH_4$ alone, without exposing to the atmosphere of the open air. As a result, the contamination of the surface of the hydrogenated silicon oxynitride film 702b can be prevented, and variance of the characteristics of the TFT to be fabricated and fluctuation of the threshold voltage can be reduced.

Figure 10A:
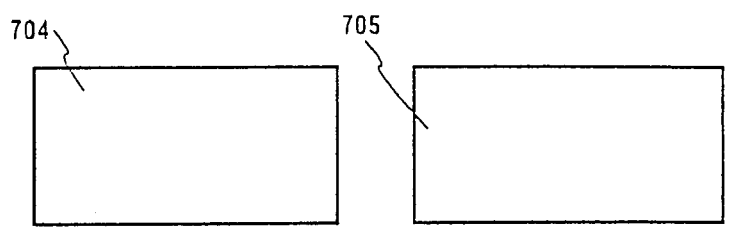
FIGS. 10A to 10E are diagrams showing a process of manufacturing an active matrix substrate.
Figure 11A:
FIGS. 11A to 11E are diagrams showing a process of manufacturing an active matrix substrate.

Island semiconductor layers 704 to 708 are then formed into the first shape as shown by dotted line in FIG. 7B, from the semiconductor layer 703 which has an amorphous structure. FIG. 10A is a top view of island semiconductor layers 704 and 705 of this state and FIG. 11A similarly shows a top view of an island semiconductor layer 708.

In FIGS. 10 and 11 the island semiconductor layers are formed into rectangles of each side at 50 μm or less however it is possible to form the shape of the island semiconductor layers arbitrarily, preferably provided that the minimum distance from its center to the edge is 50 μm or less it may can be any polygon or circular shape.

Next crystallization process is performed onto such island semiconductor layers 704 to 708. It is possible to use any method described in Embodiment Modes 1 to 3 for the crystallization process, and laser anneal is performed onto the island semiconductor layers 704 to 708 by the method of Embodiment Mode 1 in this Embodiment. Island semiconductor layers 709 to 713 are thus formed from crystalline silicon film as shown by the solid line in FIG. 7B.

Note that though the present Embodiment shows an example of forming one island semiconductor layer corresponding to one TFT, it is possible to make a plural numbers of TFTs connected in series function as one TFT by partitioning one island semiconductor layers into plural numbers, in case that the surface area exclusively used by an island semiconductor layer is large (in case that one TFT becomes large).

Figure 10B:
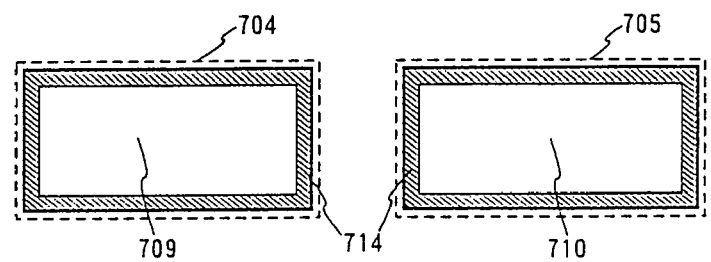
Figure 11B:
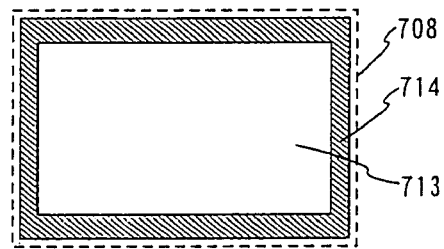

In this case the film becomes dense as the amorphous silicon film crystallizes and it shrinks by about 1 to 15%. A region 714 is formed in the edge portion of the island semiconductor layer in which strain is generated due to the shrinkage. Further, an island semiconductor layer comprising such crystalline silicon film has a pulling stress by considering the substrate as its center. FIGS. 10B and 11B respectively shows a top view of island semiconductor layers 709, 710 and 713 of this state. The regions 704, 705 and 708 shown by dotted line in the same figures show the size of the island semiconductor layers 704, 705 and 708 that existed from the first.

When a gate electrode of a TFT is formed overlapping the region 714 in which such strain is accumulated, it becomes a cause for degrading the TFT characteristics since there are a number of defect levels and the crystallinity is no good. OFF current value increases or heat is generated regionally because current is concentrated into this region, for instance.

Figure 10C:
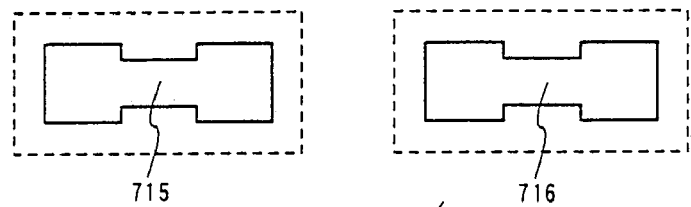
Figure 11C:
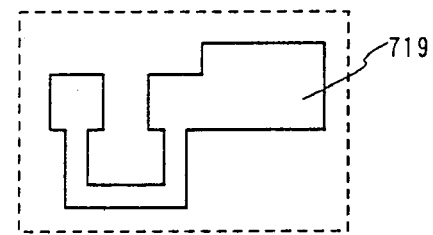

Accordingly as shown in FIG. 7C, island semiconductor layers 715 to 719 of the second shape are formed so as to remove the region 714 in which such strain is accumulated. The region 714' shown by a dotted line in the figure is an area where the region 714 in which strain is accumulated existed, and the figure shows the condition in which island semiconductor layers 715 to 719 of the second shape are formed inside such area. The shape of the island semiconductor layers 715 to 719 of the second shape may be set arbitrarily. FIG. 10C shows a top view of the island semiconductor layers 715 and 714 of this state. Further, FIG. 11C shows a top view of the island semiconductor layer 719.

Thereafter a mask layer 720 is formed from silicon oxide film into 50 to 100 nm by plasma CVD or sputtering, so as to cover the island semiconductor layers 715 to 719. An impurity element which imparts p-type may be added onto the entire surface of the island semiconductor layers of this state to a concentration from $1\times10^{16}$ to $5\times10^{17}$ atoms/cm$^3$ for the purpose of controlling the threshold voltage of the TFTs (VT).

The elements of the Group XIII of the Periodic Table such as boron (B), aluminum (Al) or gallium (Ga) are known as the impurity elements for imparting p-type to the semiconductor. Ion implantation or ion doping can be adopted as the method of doping these elements, but ion doping is suitable for processing a substrate having a large area. This ion doping method uses diborane ($B_2H_6$) as a source gas and adds boron (B). Addition of such an impurity element is not always necessary and may be omitted. However, this is the method that can be used appropriately for keeping the threshold voltage of the n-channel TFT, in particular, within a prescribed range.

In order to form an LDD region in the n-channel TFT in the driver circuit, an impurity element for imparting the n type is selectively added into island semiconductor layers 716 and 718. Resist masks 721a to 721e are formed in advance for this purpose. As an impurity element which imparts n-type, phosphorus (P) or arsenic (As) may be used and ion doping using phosphine ($PH_3$) is used here for adding phosphorus (P).

The concentration of phosphorus (P) in the formed impurity regions may be within the range of $2\times10^{16}$ to $5\times10^{19}$ atoms/cm$^3$ as the low concentration n-type impurity regions 722 and 723. Through the specification the concentration of the impurity element which imparts n-type contained in the impurity regions 722 and 723 formed here is denoted as (n−). Further, the impurity region 724 is a semiconductor layer for forming a storage capacitor of the pixel section and phosphorus (P) is added in this region as well in the same concentration. (FIG. 7D)

A step for activating the added impurity element is performed next. The activation can be performed by heat treatment in a nitrogen atmosphere at 500 to 600° C. for 1 to 4 hours or laser activation. Further, the two may be performed in combination. In case of adopting laser activation, KrF excimer laser light (wavelength 248 nm) is used, a linear beam is formed under the condition of oscillation frequency 5 to 50 Hz and energy density at 100 to 500 mJ/cm$^2$, and the beam is scanned with the overlap ratio of the linear beam to 80 to 98% to treat the entire surface of the substrate on which island semiconductor layers are formed. Note that there is no item that limits the laser light irradiation conditions and they may be appropriately determined by the operator. This process may be performed with the mask layer 720 remained, or it may be performed after removal.

In FIG. 7E, the gate insulating film 725 is formed from an insulating film containing silicon to a thickness between 40 and 150 nm by using plasma CVD or sputtering. For example, it may be formed from a silicon oxynitride film to 120 nm thickness. Further, the silicon oxynitride film manufactured by adding $O_2$ to $SiH_4$ and $N_2O$ has a reduced fixed electric charge density in the film and therefore is a preferable material for this use. Needless to say, the gate insulating film 725 is not limited to such silicon oxynitride film, and it may use a single layer or a laminate structure of other insulating films containing silicon. In any case, the gate insulating film 725 is formed so as to be a compressing stress by considering the substrate as its center.

A heat resistant conductive layer is formed as shown in FIG. 7E to form a gate electrode on the gate insulating film 725. The heat resistant conductive film may comprise a single layer, but may be a laminate structure of plurality of layers such as double layer or triple layer, if necessary. By using such heat resistant conductive materials, the structure in which the conductive layer (A) 726 comprising a conductive metal nitride film and the conductive layer (B) 727 which comprises a metal film are laminated may be formed for example.

The conductive layer (B) 727 may be formed from an element selected from tantalum (Ta), titanium (Ti), molybdenum (Mo) and tungsten (W), or an alloy film comprising mainly of these elements or an alloy film combining the above elements (typically, a Mo—W alloy film, an Mo—Ta alloy film), and the conductive layer (A) 726 may be formed from tantalum nitride (TaN), tungsten nitride (WN), titanium nitride (TiN), molybdenum nitride (MoN), etc. The conductive layer (A) 726 may adopt tungsten silicide, titanium silicide or molybdenum silicide.

The impurity concentration contained in the conductive layer (B) 727 may be preferably reduced for low resistance, specifically the oxygen concentration may be reduced to 30 ppm or below. For example, resistivity of 20 μΩcm or below can be realized with respect to tungsten (W) by setting the oxygen concentration at 30 ppm or below.

The conductive layer (A) 726 may be formed to 10 to 50 nm (preferably 20 to 30 nm) and the conductive layer (B) 727 may be formed to 200 to 400 nm (preferably 250 to 350 nm). In the case of using W for the gate electrode, tungsten nitride (WN) is formed to a thickness of 50 nm for the conductive layer (A) 726 by sputtering using W as a target and by introducing an argon (Ar) gas and a nitrogen ($N_2$) gas, and W is formed to a thickness of 250 nm for the conductive layer (B) 727. As another method, W film can be formed by thermal CVD using tungsten hexafluoride ($WF_6$).

In any case, it is necessary to devise low resistivity for using as a gate electrode, and the resistivity of the W film is preferably not higher than 20 μΩcm. The low resistivity of the W film can be accomplished by increasing the crystal grain size, but the resistivity becomes high when the contents of the impurity elements such as oxygen in W are great because crystallization is impeded. Therefore, when sputtering is employed, the W target used has a purity of 99.9999%, and sufficient attention should be paid lest impurities mix from the gaseous phase during the formation of the film. In this way, the resistivity of 9 to 20 μΩcm can be achieved.

On the other hand, in case of using TaN film for the conductive layer (A) 726 and Ta film for the conductive layer (B) 727, it is possible to form similarly by sputtering. TaN film is formed by using Ta as the target and the mixed gas of Ar and nitrogen for the sputtering gas, and argon (Ar) is used as the sputtering gas to form the Ta film. When a suitable amount of Xe or Kr is added to the sputtering gas, the internal stress of the resulting films can be mitigated and peel of the films can be prevented. The resistivity of the α phase Ta film is about 20 μΩcm, and this film can be used for the gate electrode. However, the resistivity of the β phase Ta film is about 180 μΩcm and this film is not suitable for the gate electrode. The TaN film has a crystal structure approximate to that of the α phase. Therefore, when the Ta film is formed on the TaN film, the β phase Ta film can be obtained easily.

Incidentally, though not shown in the figure, it is effective to form a phosphorus (P) doped silicon film to a thickness of about 2 to about 20 nm under the conductive layer (A) 726. By doing so, the improvement of adhesiveness and prevention of oxidation of the conductive film formed thereon can be devised and at the same time it is possible to prevent the alkali metal elements contained in the conductive layer (A) 726 or the conductive layer (B) 727 in a trace amount to diffuse into the gate insulating film 725. In any case, it is preferable to set the resistivity of the conductive layer (B) 727 within a range between 10 and 50 μΩcm.

Next, resist masks 728a to 728f are formed by photolithography by using a photo-mask, and the conductive layer (A) 726 and the conductive layer (B) 727 are collectively etched to form gate electrodes 729 to 733 and a capacitance wiring 734. These gate electrodes 729 to 733 and capacitance wiring 734 comprise a unitary structure of 729a to 733a comprising the conductive layer (A) and 729b to 733b comprising the conductive layer (B). (FIG. 8A)

Figure 10D:
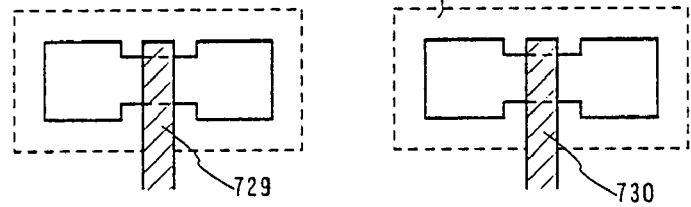
Figure 11D:
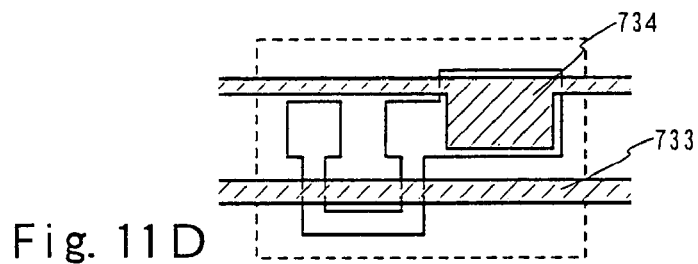

The relations of the arrangement of the island semiconductor layers 715 and 716 and gate electrodes 729 and 730 in this state is shown in FIG. 10D. Similarly the relations between the island semiconductor layer 719, the gate electrode 733 and the capacitor wiring 734 is shown in FIG. 11D. The gate insulating film 725 is omitted from FIGS. 10D and 11D.

Though the method for etching the conductive layer (A) and the conductive layer (B) may be appropriately selected by the operator, it is preferable to adopt dry etching using high density plasma for performing etching at a high speed and with high precision, in case that they are formed from a material which is mainly composed of W as described above. Microwave plasma or inductively coupled plasma (ICP) etching apparatus may be used as a means for obtaining high density plasma.

For example, in etching of W using an ICP etching apparatus, two kinds of gasses, $CF_4$ and $Cl_2$, are introduced into the reaction chamber, the pressure is set at 0.5 to 1.5 Pa (preferably 1 Pa) and high frequency (13.56 MHz) electric power of 200 to 1000 W is applied to the inductive coupling section. At this time, high frequency electric power of 20 W is applied to the stage on which the substrate is placed, charged to negative electric potential by its self bias, positive ions are accelerated and anisotropic etching can be performed. By using ICP etching apparatus, etching speed of 2 to 5 nm/second can be obtained even with hard metal films such as W, etc. Further, in order to etch without leaving residues, it is good perform over-etching by extending the etching time by a proportion of 10 to 20%. However, it is necessary to pay attention to the selective ratio of etching with the base film. For example, since the selective ratio of the silicon oxynitride film (gate insulating film 725) against W film is 2.5 to 3, the surface where the silicon oxynitride film is exposed is etched approximately 20 to 50 nm and becomes substantially thin through such over etching treatment.

Thereafter, in order to form LDD region in the n-channel TFT of the pixel TFT, a process of adding an impurity element which imparts n-type (n−doping process) is performed. An impurity element which imparts n-type may be added in a self-aligned manner by ion doping using gate electrodes 729 to 733 as the mask. The concentration of phosphorus (P) added as the impurity element which imparts n-type is set within a concentration range between $1\times10^{16}$ and $5\times10^{19}$ atoms/cm$^3$. In this way, low concentration n-type impurity regions 735 to 739 are formed in the island semiconductor layers as shown in FIG. 8B.

Formation of high concentration n-type impurity regions which function as source region or drain region (n+doping process) is performed next in n-channel TFTs. Resist masks 740a to 740d are formed first by using a photo-mask, and an impurity element imparting n-type is doped to form high concentration n-type impurity regions 741 to 746. Phosphorus (P) is used as the impurity element imparting n-type. Ion doping using phosphine ($PH_3$) is employed so that the concentration falls within the range of $1\times10^{20}$ to $1\times10^{21}$ atoms/cm$^3$ (FIG. 8C).

High concentration p-type impurity regions 748 and 749 that function as source region or drain region are formed in the island semiconductor layers 715 and 717 which form p-channel TFTs. An impurity element which imparts p-type is added here with the gate electrodes 729 and 731 as the mask and high concentration p-type impurity regions are formed in a self-aligning manner. At this time the entire surfaces of the island semiconductor films 716, 718 and 719 which form n-channel TFIs are covered by forming resist masks 747a to 747c by using a photo mask.

High concentration p-type impurity regions 748 and 749 are formed by ion doping that uses diborane ($B_2H_6$). The boron (B) concentration in the regions is $3\times10^{20}$ to $3\times10^{21}$ atoms/cm$^3$ (FIG. 8D).

Phosphorus (P) is added to the high concentration p-type impurity regions 748 and 749 in a preceding step, in a concentration of $1\times10^{20}$ to $1\times10^{21}$ atoms/cm$^3$ with respect to the high concentration p-type impurity regions 748a and 749a, and in a concentration of $1\times10^{16}$ to $5\times10^{19}$ atoms/cm$^3$ with respect to the high concentration p-type impurity regions 748b and 749b. However, by setting the concentration of boron (B) added in this step to become 1.5 to 3 times higher, no trouble occurs in the function as the source and drain regions of the p-channel TFT.

Figure 9A:
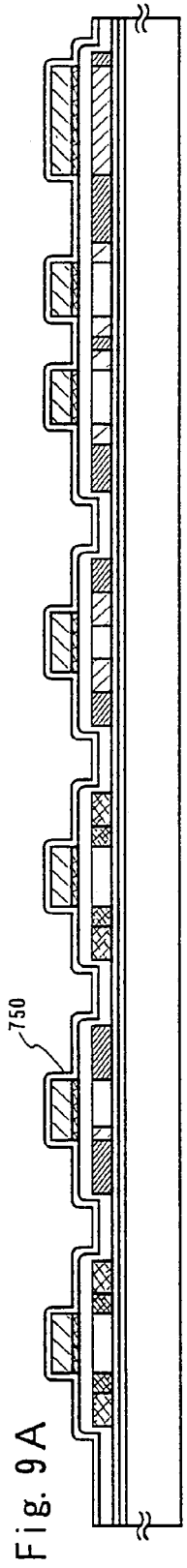
FIGS. 9A to 9C are diagrams showing a process of manufacturing an active matrix substrate.

Thereafter, as shown in FIG. 9A, a protective insulating film 750 is formed from above the gate electrode and the gate insulating film. The protective insulating film may comprise a silicon oxide film, a silicon oxynitride film, a silicon nitride film or a laminate film comprising the combination of these films. In any case, the protective insulating film 750 is formed of an inorganic insulating material. The protective insulating film 750 has a film thickness of 100 to 200 nm.

When the silicon oxide film is used, tetraethyl orthosilicate (TEOS) and $O_2$ are mixed, and the film can be formed by plasma CVD with a reaction pressure of 40 Pa, a substrate temperature of 300 to 400° C. and plasma is discharged at a high frequency (13.56 MHZ) power density of 0.5 to 0.8 W/cm$^2$. When the silicon oxynitride film is used, the film may comprise a silicon oxynitride film formed by plasma CVD from $SiH_4$, $N_2O$ and $NH_3$ or a silicon oxynitride film formed from $SiH_4$ and $N_2O$. The film deposition condition in this case is the reaction pressure of 20 to 200 Pa, the substrate temperature of 300 to 400° C., and the high frequency (60 MHZ) power density of 0.1 to 1.0 W/cm$^2$. The hydrogenated silicon oxynitride film formed from $SiH_4$, $N_2O$ and $H_2$ may be used, as well. The silicon nitride film can be formed similarly from $SiH_4$ and $NH_3$ by plasma CVD. The protective insulating film is formed to be a compressing stress by considering the substrate as the center.

Figure 9B:
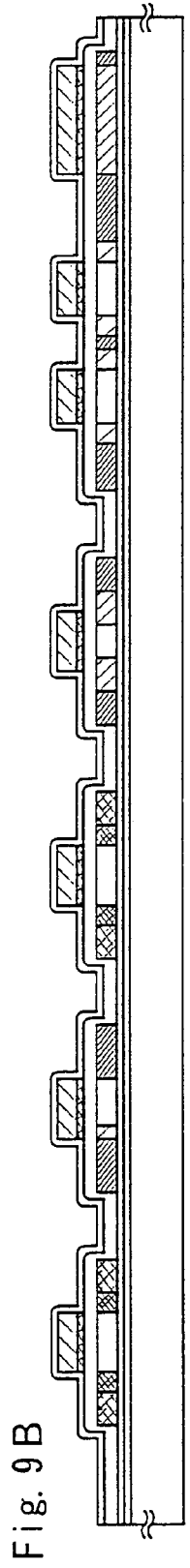

Thereafter, the step of activating the impurity elements imparting n-type or p-type added in the respective concentrations is conducted. This step is conducted by a thermal annealing method using a furnace annealing oven. Besides the thermal annealing method, it is possible to employ a laser annealing method and a rapid thermal annealing method (RTA method). The thermal annealing method is conducted in a nitrogen atmosphere containing oxygen in a concentration of 1 ppm or below, preferably 0.1 ppm or below, at 400 to 700° C., typically 500 to 600° C. In this embodiment, the heat-treatment is conducted at 550° C. for 4 hours. When a plastic substrate having a low heat-resistant temperature is used for the substrate 101, the laser annealing method is employed (FIG. 9B).

After the activation step, heat-treatment is further conducted in an atmosphere containing 3 to 100% hydrogen at 300 to 450° C. for 1 to 12 hours to hydrogenate the island semiconductor layers. This is the process step that terminates the dangling bonds in the island semiconductor layers by hydrogen that is thermally excited. Plasma hydrogenation (using hydrogen that is excited by plasma) may be used as another means for hydrogenation. Further if the thermal resistance of the substrate 701 permits, island semiconductor layers may be hydrogenated by diffusing hydrogen from the hydrogenated silicon oxynitride film 702b of the base film and the hydrogenated silicon oxynitride film of the protective insulating film 750, by heat treatment at 300 to 450° C.

After the activation and hydrogenation steps are completed, an interlayer insulating film 751 made of an organic insulating material is formed to a mean thickness of 1.0 to 2.0 μm. As the organic resin materials, polyimide, acrylic, polyamide, polyimidamide, BCB (benzocyclobutene), and so forth can be used. For example, when polyimide of the type, that is thermally polymerized after being applied to the substrate, is used, the material is baked at 300° C in a clean oven. When acrylic is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes.

By forming the interlayer insulating film from an organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulating material must be used in combination with the silicon oxide film, the silicon oxynitride film or the silicon nitride film formed as the protective insulating film 750 as in this embodiment.

Thereafter, a resist mask having a predetermined pattern is formed by using a photo-mask. Contact holes reaching the source or drain regions of the respective island semiconductor layers are formed. The contact holes are formed by dry etching. In this case, a mixed gas of $CF_4$, $O_2$ and He is used as the etching gas. The interlayer insulating film 751 formed of the organic insulating material is first etched. Then, the etching gas is switched to $CF_4$ and $O_2$, and the protective insulating film 750 is etched. To improve the selective ratio with the island semiconductor layers, the etching gas is switched further to $CHF_3$ and the gate insulating film 725 is etched. In this way, the contact holes can be formed satisfactorily.

A conductive metal film is then formed by sputtering or vacuum vapor deposition, a resist mask is formed by a photo mask and source wirings 752 to 756 and drain wirings 757 to 761 are formed by etching. The drain wiring 762 denotes a drain wiring of the adjoining pixel. Here, the drain wiring 761 also functions as the pixel electrode. Though not shown in the figure, this electrode is formed from Ti film to a thickness between 50 to 150 nm, contact is formed with the semiconductor film which forms a source or drain region in the island semiconductor layer, and aluminum (Al) is formed to a thickness from 300 to 400 nm on the Ti film, thereby forming a wiring.

Figure 10E:
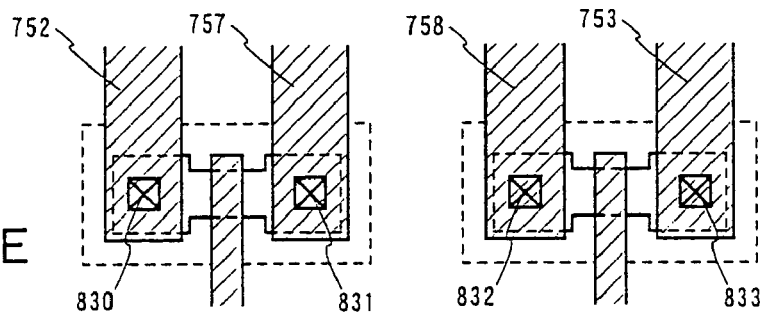

FIG. 10E shows a top view of island semiconductor layers 715 and 716, gate electrodes 729 and 730, source wirings 752 and 753 and drain wirings 757 and 758 in this state. Source wirings 752 and 753 are connected to the island semiconductor layers 715 and 716 through contact holes disposed in the interlayer insulating film (not shown) and the protective insulating film at reference numerals 830 and 833. Further, drain wirings 757 and 758 are connected to the island semiconductor layers 715 and 716 in 831 and 832.

Figure 11E:
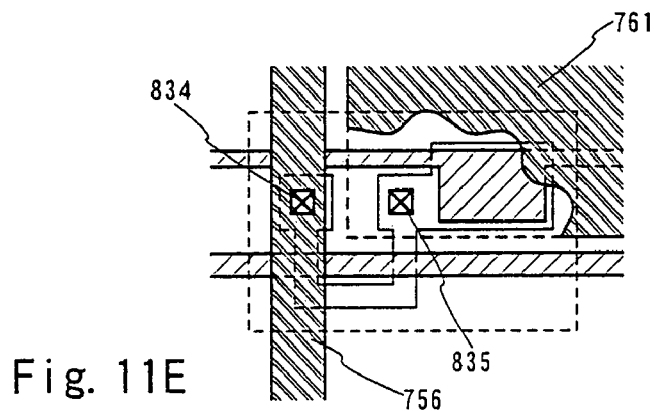

Similarly FIG. 11E shows a top view of the island semiconductor layer 719, the gate electrode 733, the capacitor wiring 734, the source wiring 756 and the drain wiring 761 and the source wiring 756 is connected to the island semiconductor layers 719 in the contact portion 834, and the drain wiring 761, in the contact portion 835.

In any case, TFTs are formed by forming island semiconductor layers that have the second shape by removing the areas where strain remains in an area inside of the island semiconductor layers having the first shape.

Figure 9C:
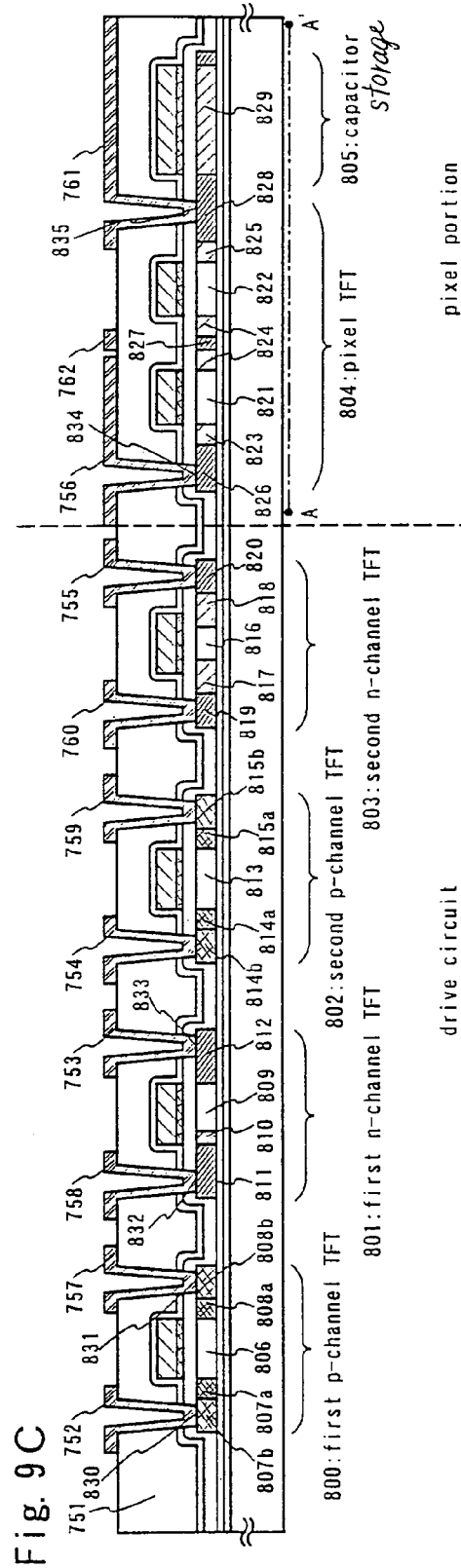

When the hydrogenation treatment is conducted under this state, favorable results can be obtained for the improvement of TFT performance. For example, the heat-treatment may be conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulating film 750 and the base film 702 into the island semiconductor films 715 to 719 and can hydrogenate these films. In any case, the defect density in the island semiconductor layers 715 to 719 is lowered preferably to $10^{16}/cm^3$ or below, and for this purpose, hydrogen may be added in an amount of about $5\times10^{18}$ to $5\times10^{19}$ atoms/$cm^3$. (FIG. 9C)

Thus a substrate having the TFTs of the driving circuit and the pixel TFTs of the pixel portion over the same substrate can be completed. The first p-channel TFT 800, the first n-channel TFT 801, the second p-channel TFT 802 and the second n-channel TFT 803 are formed in the driving circuit. The pixel TFT 804 and the storage capacitance 805 are formed in the pixel portion. In this specification, such a substrate will be referred to as an "active matrix substrate" for convenience sake.

The first p-channel TFT 800 in the driving circuit has a single drain structure that comprises in the island semiconductor film 715: the channel formation region 806; and the source regions 807a and 807b and the drain regions 808a and 808b each comprising the high concentration p-type impurity region.

In the island semiconductor film 716 of the first n-channel TFT 801, there are formed: the channel formation region 809; the LDD region 810 that overlaps the gate electrode 730; the source region 812; and the drain region 811. In the LDD region, the length of this LDD region which overlaps the gate electrode 730 in the direction of the channel length is 0.5 to 3.0 μm, preferably 1.0 to 2.0 μm. As the length of the LDD region in the n-channel TFT is determined in this way, a high electric field occurring in the proximity of the drain region can be mitigated, and the occurrence of hot carriers and degradation of the TFT can be prevented.

The second p-channel TFTl 802 of the driver circuit has the single drain structure similarly in which the channel formation region 813, the source regions 814a and 814b and the drain regions 815a and 815b comprising the high concentration p-type impurity region are formed in the island semiconductor film 717.

A channel formation region 816, LDD regions 817 and 818 which partially overlap the gate electrode 732, a source region 820 and a drain region 819 are formed in the island semiconductor film 718 of the second n-channel TFT 803. The length of the LDD regions that overlap the gate electrode 732 is also set at between 0.5 and 3.0 μm, preferably 1.0 to 2.0 μm. Further, the length of the LDD regions that do not overlap the gate electrodes in the channel length direction is 0.5 to 4.0 μm, preferably 1.0 to 2.0 μm.

The channel forming regions 821 and 822, LDD regions 823 to 825, source or drain regions 826 to 828 are formed in the island semiconductor film 719 of the pixel TFT 804. The length of the LDD region in the direction of the channel length is 0.5 to 4.0 μm, preferably 1.5 to 2.5 μm. The storage capacitance 805 is formed from the capacitor wiring 734, the insulating film comprising the same material as the gate insulating film and the semiconductor layer 829 that is connected to the drain region 828 of the pixel TFT 804. In FIG. 9C, the pixel TFT 804 is a double gate structure. However, it may have a single gate structure or a multi-gate structure having a plurality of gate electrodes.

Figure 12:
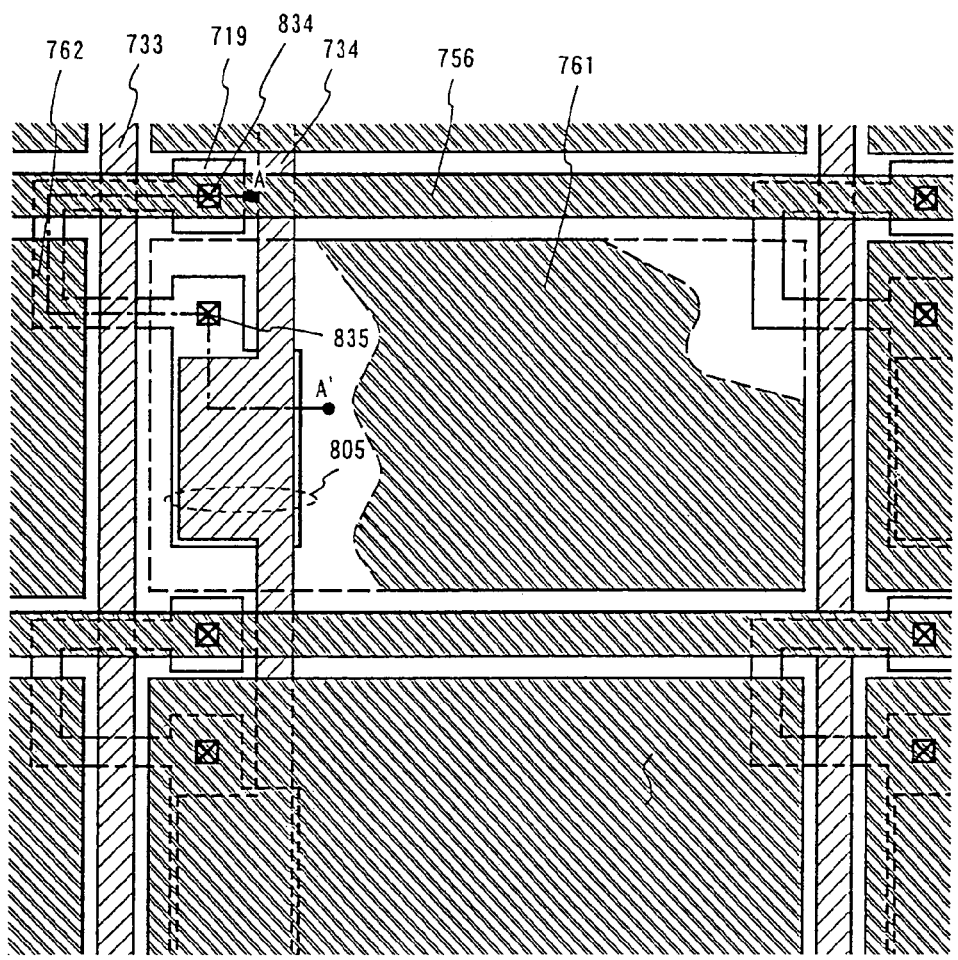
FIG. 12 is a diagram showing a pixel structure.

FIG. 12 is a top view showing almost one pixel of the pixel portion. The cross section A-A' in the drawing corresponds to the sectional view of the pixel portion shown in FIG. 9C. The gate electrode 733 of the pixel TFT 804 crosses the island semiconductor layer 719 below it through a gate insulating film, not shown in the drawing. The source region, the drain region and the LDD region are formed in the island semiconductor layer, though they are not shown in the drawing. Reference numeral 834 denotes a contact portion between the source wiring 756 and the source region 826. Reference numeral 835 denotes a contact portion between the drain wiring 761 and the drain region 828. A storage capacitance 805 is formed by the overlapping region of the semiconductor layer 829 that extends from the drain region 828 of the pixel TFT 804 and a capacitance wiring 734 through the gate insulating film.

An active matrix substrate is completed as described above. The active matrix substrate manufactured in accordance with the present Embodiment arranges TFTs of appropriate structures corresponding to the specifications of the pixel section and the driver circuit. By doing so it enables to improve operation performance and the reliability of the electro-optical device which uses this active matrix substrate.

Note that in this Embodiment the drain wiring 761 of the pixel TFT 804 is used as it is to the pixel electrode and has a structure corresponding to a reflection type liquid crystal display device. However, the present invention can correspond to a transmission type liquid crystal display device by forming a pixel electrode comprising a transparent conductive film which is electrically connected to the drain wiring 761.

Further, the present Embodiment is an example of manufacturing process of a semiconductor device using the present invention is not necessarily limited to the material and the numerical value range shown in this Embodiment. Further, the arrangement of the LDD regions, etc., may appropriately determined by the operator.

Embodiment 2

The example shown in Embodiment 1 is crystallization of an amorphous semiconductor film by using the methods described in Embodiment Modes 1 to 3 to perform laser annealing on the film. In the example, the laser annealing may be performed instead on a semiconductor film that has been crystallized to a certain degree but not thoroughly.

That is, the laser annealing in accordance with the present invention is also effective in the case where a crystalline semiconductor film that has been crystallized by furnace annealing is further projected to laser annealing to enhance its crystallinity.

To be specific, the laser annealing method of Embodiment Modes 1 to 3 may be used in the laser irradiation step described in Japanese Patent Application Laid-open No. Hei 7-321339, Japanese Patent Application Laid-open No. Hei 7-131034, and some other applications.

After the present invention is applied to the laser irradiation step of the above publications, a TIT using the crystalline semiconductor film formed through that step may be formed. In other words, this embodiment can be combined with Embodiment 1.

Embodiment 3

Figure 13A:
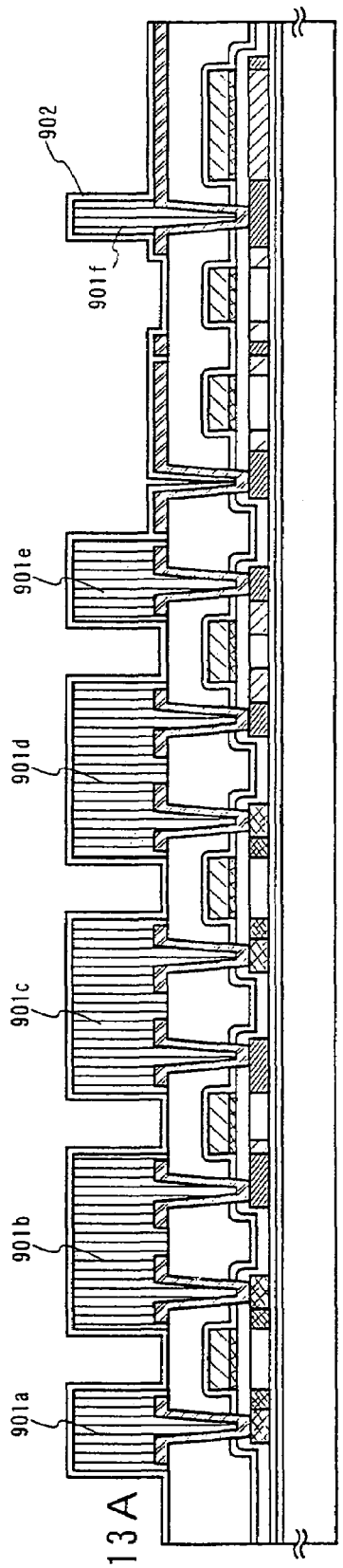
FIGS. 13A and 13B are diagrams showing the sectional structure of an active matrix type liquid crystal display device.

This embodiment gives a description of a process of manufacturing an active matrix type liquid crystal display device using an active matrix substrate that is fabricated in accordance with Embodiments 1 and 2. First, as shown in FIG. 13A, spacers 901*a* to 901*f* are formed from a resin material by patterning on an active matrix substrate that is in a state illustrated in FIG. 9C. Alternatively, a known spherical silica or the like may be dispersed and used as the spacer.

In this embodiment, as the spacers 901*a* to 901*f* made of a resin material, NN 700 produced by JSR is applied by a spinner and is then formed into a given pattern through exposure and development treatment. Further, it is heated in a clean oven or the like at a temperature of 150 to 200° C. to cure. The thus formed spacers may vary in shape depending on exposure conditions and development treatment conditions. A preferable shape for the spacers is a column with flat top, because it ensures the mechanical strength as a liquid crystal display panel when the active matrix substrate is bonded to an opposite substrate.

There is no particular limitation on the shape of the spacers and they may take a conical shape, a pyramidal shape, etc. When a conical shape is adopted, for example, specific dimensions of the spacers will be as follows: a height H of 1.2 to 5 μm, a mean radius L1 of 5 to 7 μm, and the ratio between the mean radius L1 and a radius L2 of 1 to 1.5, with a taper angle of ±15° or less on their sides.

Any arrangement may be taken for the spacers 901*a* to 901*f*. A preferred arrangement is as shown in FIG. 13A, in which the spacers are formed to overlap and cover the contact portion 835 of the drain wiring 761 (pixel electrode) in the pixel portion. Otherwise, the levelness is lost at the contact portion 835 to fail to orientate liquid crystal there properly. By filling the contact portion 835 with the resin for the spacer, discrimination or the like can be prevented.

An orientation film 902 is then formed. Usually, polyimide resin is used for an orientation film of a liquid crystal display element. After forming the orientation film, rubbing treatment is performed so that liquid crystal molecules are orientated with a certain pretilt angle. It is preferable that a region that has not received the rubbing treatment extends equal to or less than 2 μm in the rubbing direction from the ends of the spacers 901*a* to 901*f* provided in the pixel portion. In rubbing treatment, static electricity generated often causes trouble. If the spacers 901*a* to 901*f* are formed to the extent to cover, at least, the source wiring and the drain wiring on the TFT of the driver circuit, they not only serve their original role as a spacer but also protect the TFT from static electricity in the rubbing process.

A light shielding film 904, an opposite electrode 905 made of a transparent conductive film, and an orientation film 906 are formed on an opposite substrate 903. As the light shielding film 904, a Ti, Cr, or Al film is formed to a thickness of 150 to 300 nm. The opposite substrate is then bonded, with a sealing material 907, to the active matrix substrate that has the pixel portion and the driver circuit formed thereon. A filler 908 is mixed in the sealing material 907, and the filler 908 together with the spacers 901*a* to 901*f* bonds the opposite substrate and the active matrix substrate with a uniform gap therebetween.

Then a liquid crystal material 909 is injected between the substrates, which are sealed completely with an end-sealing material (not shown). A known liquid crystal material may be used as the liquid crystal material 909. For instance, a material that may be used other than a TN liquid crystal is a thresholdless antiferroelectric mixed liquid crystal exhibiting an electro-optical response with which transmittance varies continuously with respect to the electric field. Some thresholdless antiferroelectric mixed liquid crystal show an electro-optical response that forms a shape of letter V when graphed. For details thereof, see "Characteristics and Driving Scheme of Polymer-stabilized Monostable FLCD Exhibiting Fast Response Time and High Contrast Ratio with Gray-scale Capability", H. Furue et al., SID, 1998, "A Full-color Thresholdless Antiferroelectric LCD Exhibiting Wide Viewing Angle with Fast Response Time". T. Yoshida et al., 841, SID '97 DIGEST, 1997, "Thresholdless Antiferroelectricity in Liquid Crystals and Its Application to Displays, S. Inui et al., 671-673, J. Mater. Chem. 6 (4), 1996, and U.S. Pat. No. 5,594,569.

Figure 13B:
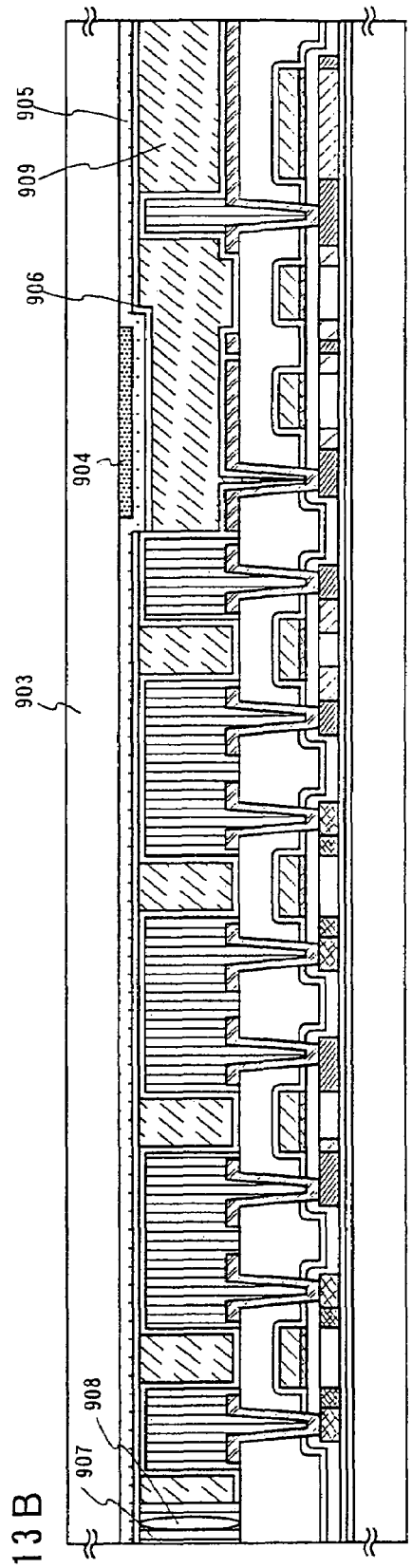

The active matrix type liquid crystal display device shown in FIG. 13B is thus completed. Although the spacers 901a to 901e are formed separately on at least the source wiring and the drain wiring on the TFT of the driver circuit in FIGS. 13A and 13B, the spacers may instead be formed to cover the entire surface of the driver circuit.

Figure 14:
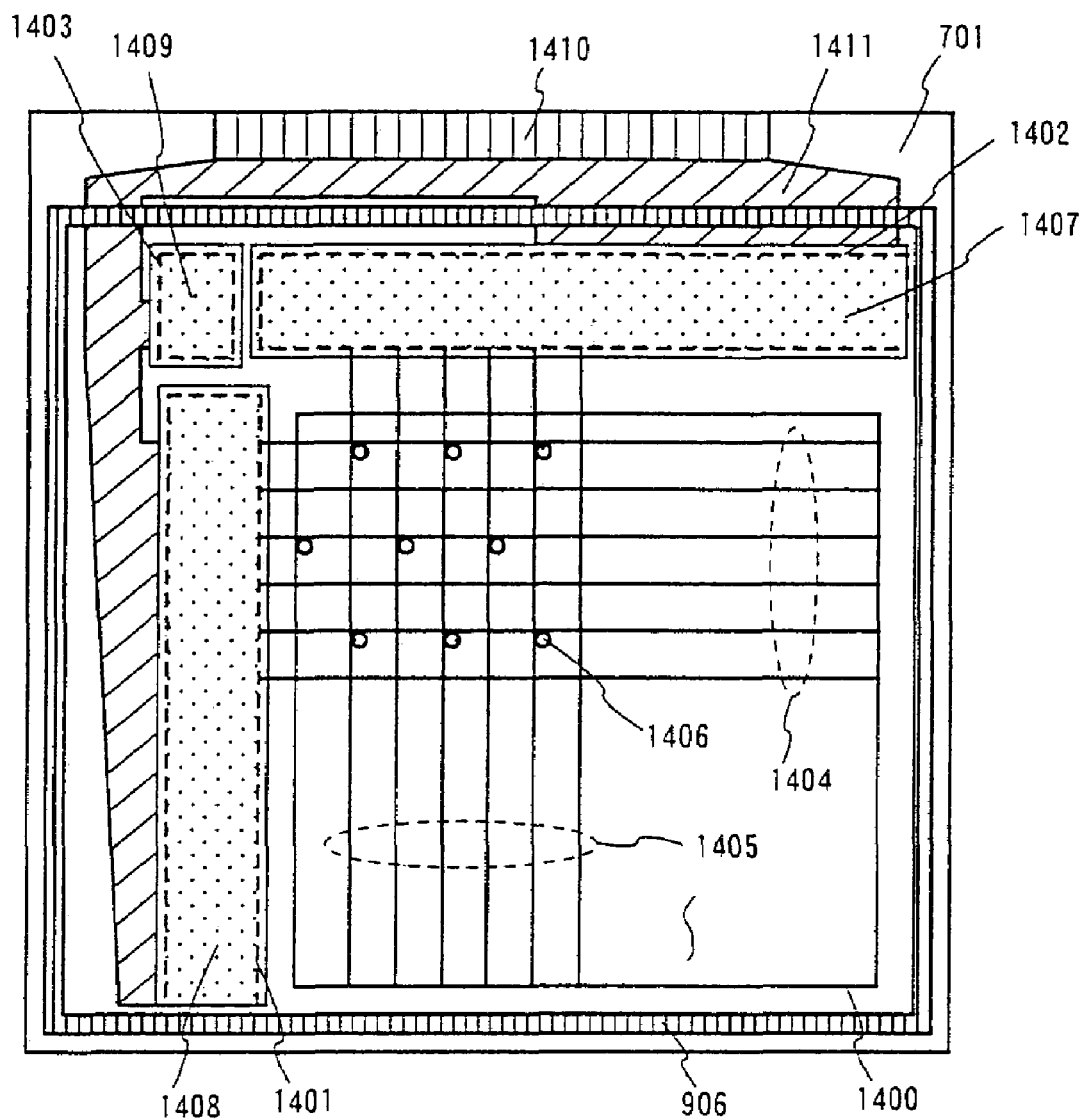
FIG. 14 is a diagram showing the top structure of an active matrix type liquid crystal display device.

FIG. 14 is a top view of an active matrix substrate, showing the positional relation of a pixel portion and a driver circuit portion to a spacer and a sealing material. A scanning signal driver circuit 1401 and an image signal driver circuit 1402 are provided as driver circuits in the periphery of a pixel portion 1400. A signal processing circuit 1403 such as a CPU and a memory may or may not be added thereto.

These driver circuits are connected to external input/output terminal 1410 via a connecting wiring 1411. In the pixel portion 1400, a gate wiring group 1404 extending from the scanning signal driver circuit 1401 and a source wiring group 1405 extending from the image signal driver circuit 1402 intersect like a matrix to form pixels. Each of the pixels is provided with a pixel TFT 804 and a capacitor storage 805.

The spacer 1406 provided in the pixel portion corresponds to the spacer 901f, and may be provided for every pixel. Alternatively, one spacer may be provided for every several pixels or for every several tens pixels arranged in matrix. That is, the ratio of the spacers to the total of the pixels is appropriately 20 to 100%. Spacers 1407 to 1409 provided in the driver circuit portion may cover the entire surface thereof, or may be separated into plural pieces to coincide with the position of the source wiring and the drain wiring of each TFT as shown in FIGS. 13A and 13B.

The sealing material 907 is formed outside the pixel portion 1400, the scanning signal control circuit 1401, the image signal control circuit 1402, and other signal processing circuit 1403, which are all on a substrate 701, and inside the external input/output terminal 1410.

Figure 15:
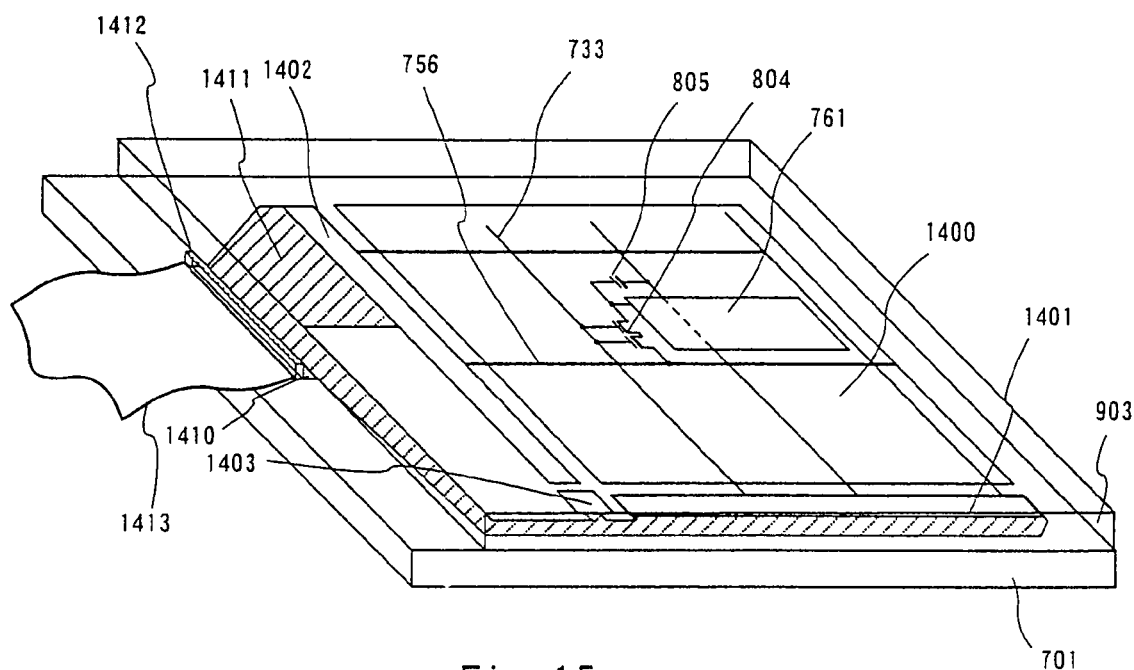
FIG. 15 is a perspective view showing an active matrix type liquid crystal display device.

The structure of such an active matrix type liquid crystal display is described with reference to a perspective view of FIG. 15. In FIG. 15, the active matrix substrate is comprised of the pixel portion 1400, the scanning signal driver circuit 1401, the image signal driver circuit 1402, and other signal processing circuit 1403 which are formed on the glass substrate 701.

The pixel portion 1400 is provided with the pixel TFT 804 and the capacitor storage 805, and the driver circuits provided in the periphery of the pixel portion are constructed based on a CMOS circuit. The scanning-signal driver circuit 1401 and the image signal driver circuit 1402 are connected to the pixel TFT 804 through a gate wiring 733 and a source wiring 756, respectively. A flexible printed circuit 1413 is connected to the external input/output terminal 1410 with the intention of using it to input an image signal or the like. The flexible printed circuit (FPC) 1413 is fixed with a reinforced resin 1412 with an enhanced adhesion strength. The FPC is connected to each driver circuit via the connecting wiring 1411. Though not shown in the drawing, an opposite substrate 903 is provided with a light shielding film and a transparent electrode.

The liquid crystal display device having the structure as such can be fabricated using an active matrix substrate shown in Embodiments 1 and 2. Employing an active matrix substrate shown in FIG. 9C, for instance, a reflection type liquid crystal display device is obtained, while a transmission type liquid crystal display device is obtained when employing an active matrix substrate that uses a transparent conductive film for a pixel electrode as shown in Embodiment 1.

Embodiment 4

Although Embodiments 1 to 3 show examples where the present invention is applied to a liquid crystal display device, the invention is applicable to any semiconductor device as long as it uses a TFI.

Specifically, the present invention can be implemented in laser annealing step of a semiconductor film in manufacturing an active matrix type EL (electroluminescence) display device or an active matrix type EC (electrochromics) display device. In that case, any of the structures of Embodiment Modes 1 to 3 may be employed.

The present invention is an invention pertaining to the laser annealing step out of a manufacturing process of a TFT, and known procedures may be applied to the rest of the steps of the manufacturing process. Therefore, the present invention is applied to known techniques when manufacturing an active matrix type EL display device or an active matrix type EC display device. To fabricate these display devices referring to the manufacturing process illustrated in FIGS. 7A to 9C is also possible, of course.

Embodiment 5

The present invention can be embodied for an electronic device (also called electronic equipment) having an electro-optical device such as an active matrix type liquid crystal display device or an active matrix type EL as its display. As the electronic device, a personal computer, a digital camera, a video camera, a portable information terminal (such as a mobile computer, a cellular phone, and an electronic book) a navigation system, etc. can be named.

Figure 16A:
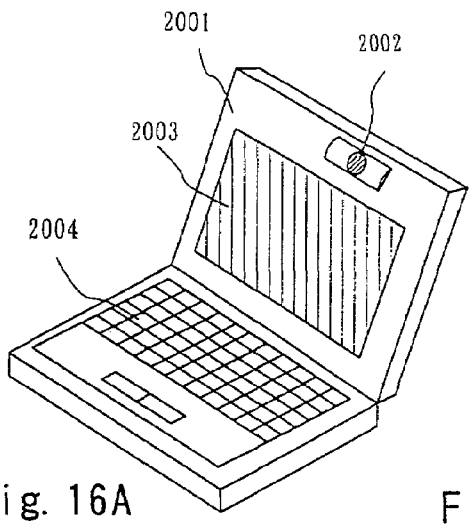
FIGS. 16A to 16F are diagrams showing examples of an electronic device.

FIG. 16A shows a personal computer that is comprised of a main body 2001 provided with a micro processor, a memory, etc., an image input unit 2002, a display unit 2003, and a keyboard 2004. The present invention can be implemented in fabricating the display unit 2003 and other signal processing circuits.

Figure 16B:
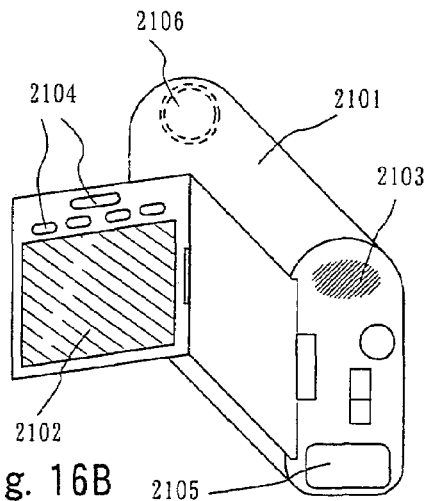

FIG. 16B shows a video camera that is comprised of a main body 2101, a display unit 2102, an audio input unit 2103, operation switches 2104, a battery 2105, and an image receiving unit 2106. The present invention can be implemented in fabricating the display unit 2102 and other driver circuits.

Figure 16C:
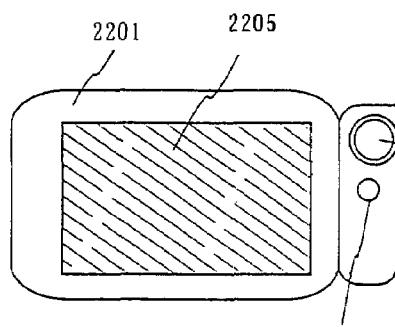

FIG. 16C shows a goggle type display that is comprised of a main body 2201, display units 2202, and arm portions 2203. The present invention can be implemented in fabricating the display units 2202 and other not-shown driver circuits.

Figure 16D:
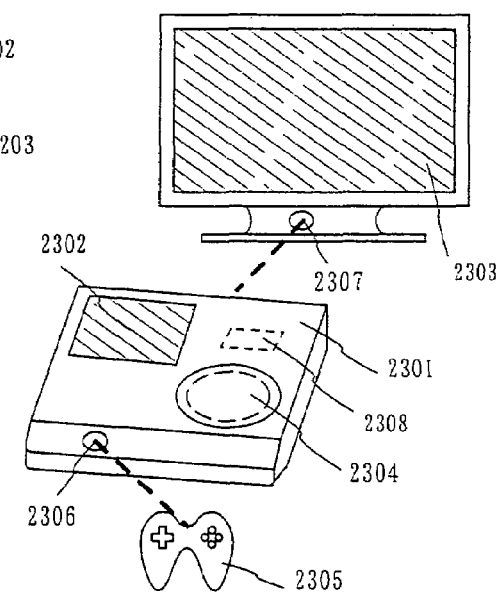

FIG. 16D shows an electronic game machine that is comprised of a main body 2301 loaded with an electric circuit 2308 such as a CPU and with a recording medium 2304, a controller 2305, a display unit 2303, and a display unit 2302 incorporated in the main body 2301. The display unit 2303 and the display unit 2302 incorporated in the main body 2301 may display the same information. Alternatively, the former may serve as a main display unit while the latter serve as a sub-display unit to display information of the recording medium 2304 or the operation status of the machine. The latter may instead serve as an operating panel by adding thereto the touch sensor function. The main body 2301, the controller 2305 and the display unit 2303 transmit signals to one another through wired communication, or through wireless communication or optical communication by providing sensor units 2306, 2307. The present invention can be implemented in fabricating the display units 2302, 2303. A conventional CRT display may be used as the display unit 2303.

Figure 16E:
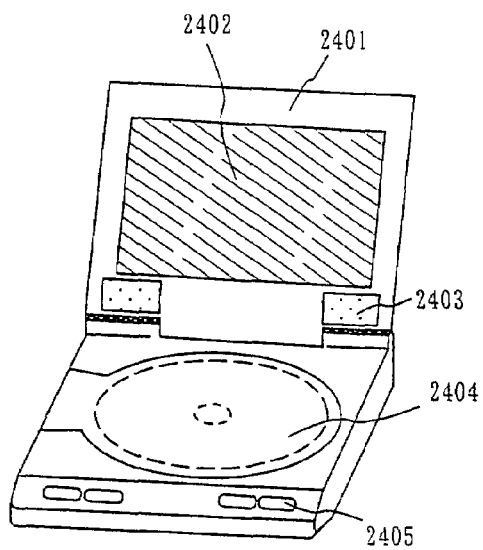

FIG. 16E shows a player which uses a recording medium in which a program is stored (hereinafter referred to as a recording medium) and which is comprised of a main body 2401, a display unit 2402, speaker units 2403, a recording medium 2404, and operation switches 2405. A DVD (Digital Versatile Disc), a compact disc (CD) or the like is used as the recording medium to enable the player to reproduce a music program, display an image, play a video game (or a television game), or display information obtained through the Internet. The present invention can be implemented in fabricating the display unit 2402 and other driver circuits.

Figure 16F:
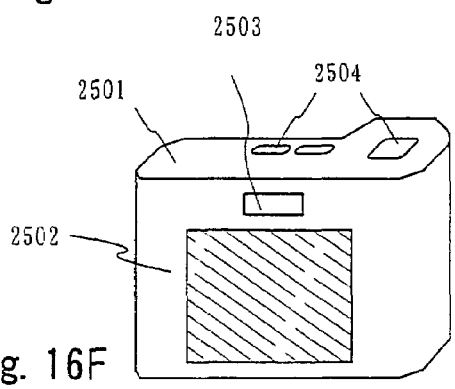

FIG. 16F shows a digital camera that is comprised of a main body 2501, a display unit 2502, an eye-piece portion 2503, operation switches 2504, and an image receiving unit (not shown). The present invention can be implemented in fabricating the display unit 2502 and other driver circuits.

Figure 17A:
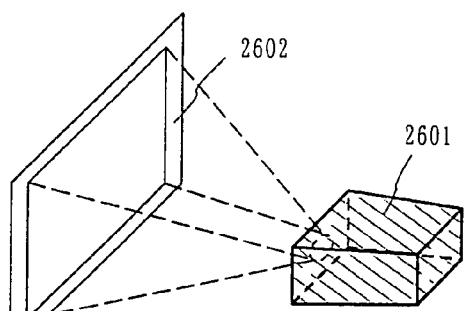
FIGS. 17A to 17D are diagrams showing examples of a projector.
Figure 17B:
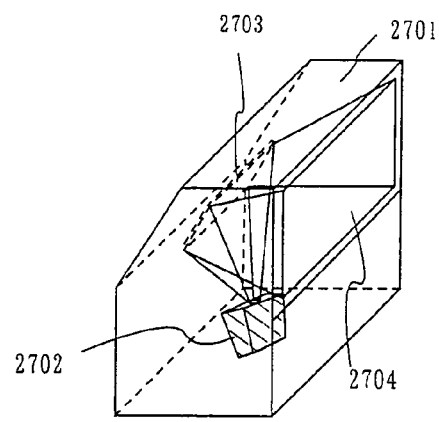

FIG. 17A shows a front type projector that is comprised of a light source optical system and display device 2601, and a screen 2602. The present invention can be implemented in fabricating the display device and other driver circuits. FIG. 17B shows a rear type projector that is comprised of a main body 2701, a light source optical system and display device 2702, a mirror 2703, and a screen 2704. The present invention can be implemented in fabricating the display device and other driver circuits.

Figure 17C:
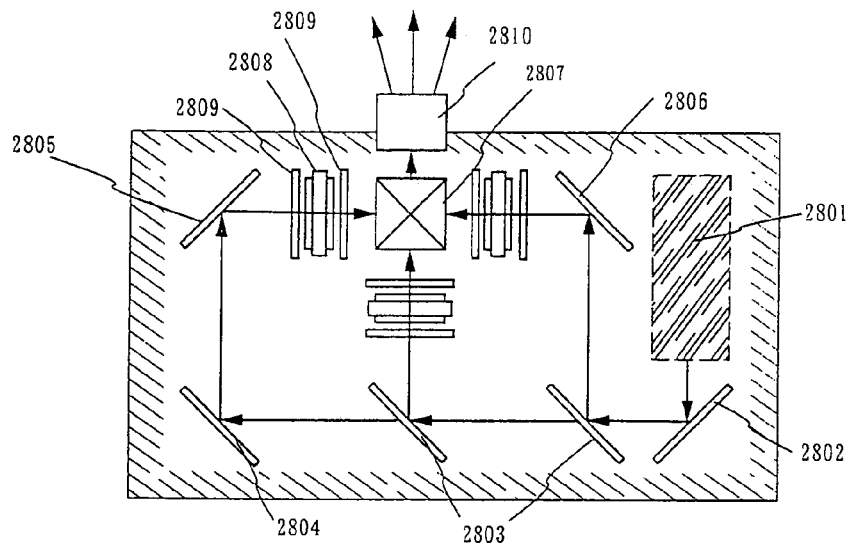

Illustrated in FIG. 17C is an example of the structure of the light source optical system and display devices 2601, 2702 that are shown in FIGS. 17A and 17B, respectively. Each of the light source optical system and display devices 2601, 2702 is comprised of a light source optical system 2801, mirrors 2802, 2804 to 2806, dichroic mirrors 2803, a beam splitter 2807, liquid crystal display devices 2808, phase difference plates 2809, and a projection optical system 2810. The projection optical system 2810 is made up of a plurality of optical lenses.

FIG. 17C shows a three panel type where three liquid crystal display devices 2808 are used. However, the light source optical system and display devices are not limited to this type and may be composed of a single panel type optical system. A light path indicated by the arrow in FIG. 17C may suitably be provided with an optical lens, a film having a polarizing function a film for adjusting the phase, an IR film, etc.

Figure 17D:
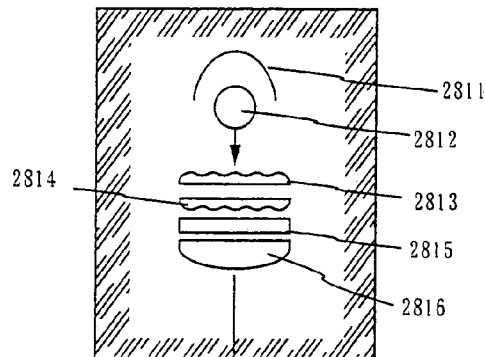

Illustrated in FIG. 17D is an example of the structure of the light source optical system 2801 that is shown in FIG. 17C. In this embodiment, the light source optical system 2801 is comprised of a reflector 2811, a light source 2812, lens arrays 2813, 2814, a polarization converting element 2815, and a condenser lens 2816. Note that the light source optical system shown in FIG. 17D is an example and the system 2801 is not limited to the illustrated structure.

Although not shown in here, the present invention may be implemented in manufacturing a navigation system, a reading circuit for an image sensor, etc., in addition to those applications illustrated in the above. The application range of the present invention is thus so wide that the invention can be implemented in manufacturing electronic devices of any field.

Embodiment 6

Figure 18:
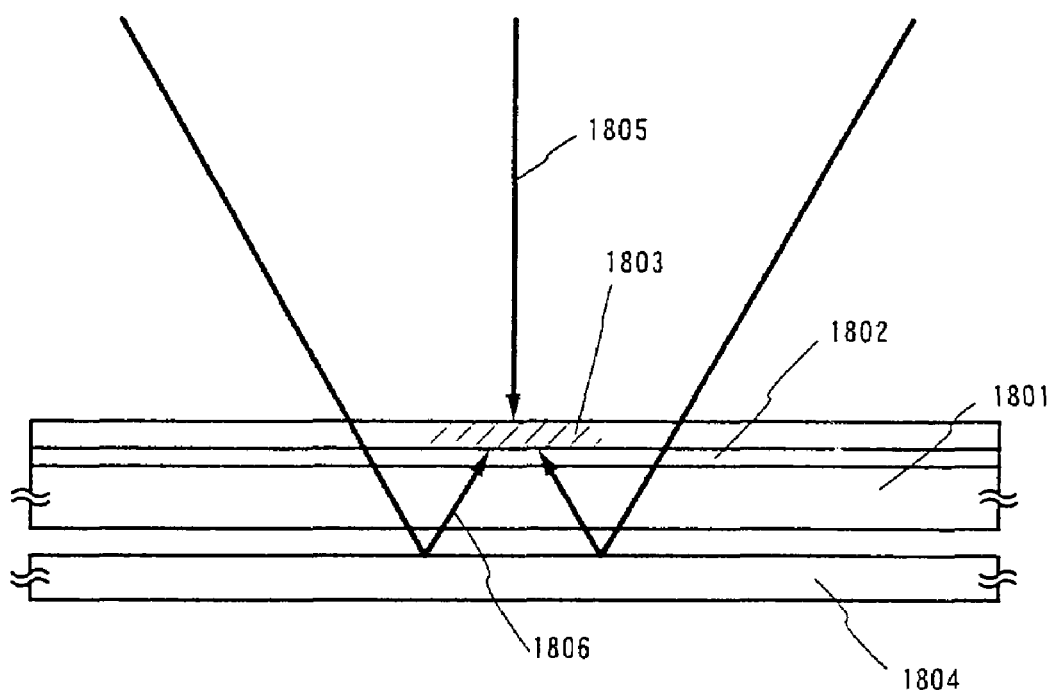
FIG. 18 is a diagram illustrating a laser annealing method of the present invention.

In contrast to Embodiment 1 where the methods of Embodiment Modes 1 to 3 are used after patterning, this embodiment shows an example with reference to FIG. 18 in which irradiation with laser light is carried out using the method of Embodiment Mode 1 before the patterning.

First, a state shown in FIG. 7A is obtained in accordance with Embodiment 1.

A step of crystallizing the semiconductor film is then conducted. A description will be given below on the crystallization step employed in this embodiment, i.e., irradiating the front side and the back side of the semiconductor film with laser light, which is illustrated in FIG. 18.

In FIG. 18, reference symbol 1801 denotes a light transmittable substrate with an insulating film 1802 and an amorphous semiconductor film (or a microcrystal semiconductor film) 1803 formed on its front side. A reflective member 1804 for reflecting laser light is arranged beneath the light transmittable substrate 1801.

The light transmittable substrate 1801 may be a glass substrate, a quartz substrate, a crystallized glass substrate or a plastic substrate. The light transmittable substrate 1801 by itself can adjust the effective energy intensity of a secondary laser light. For the insulating film 1802, an insulating film containing silicon, such as a silicon oxide film or a silicon oxide nitride film (SiOxNy) film, may be used. The adjustment of the effective energy intensity of the secondary laser light may be made by the insulating film 1802 instead.

In the structure of FIG. 18, the secondary laser light is a laser light that passed through the amorphous semiconductor film 1803 once and then reflected at the reflective member 1804. Accordingly, it is also possible to adjust the effective energy intensity of the secondary laser light by the amorphous semiconductor film 1803. Examples of the amorphous semiconductor film 1803 include a compound semiconductor film such as an amorphous silicon germanium film, other than an amorphous silicon film.

A metal film formed on a surface (where the laser light is to be reflected) of a substrate may be used as the reflective member 1804. Alternatively, a substrate formed of an metal element may serve as the reflective member 1804. In that case, any material may be used for the metal film. Typically used is a metal film containing any element chosen out of silicon (Si), aluminum (Al), silver (Ag), tungsten (W), titanium (Ti), and tantalum (Ta). For example, titanium nitride or tantalum nitride (TaN) may be used.

The reflective member 1804 may be provided in contact with the light transmittable substrate 1801, or spaced apart therefrom. It is also possible to directly form a metal film as above on the back side (opposite side of the front side) of the substrate 1801, instead of arranging the reflective member 1804, so that the laser light is reflected at the metal film. In either way, the effective energy intensity of the secondary laser light can be adjusted by changing the reflectance of the reflective member 1804. If the reflective member 1804 is placed apart from the light transmittable substrate 1801, it is also possible to adjust the effective energy intensity of the secondary laser light by gas charged in a gap between the reflective member and the substrate.

The amorphous semiconductor film 1803 is then irradiated with the laser light that has been linearized through the optical system 201 (only the cylindrical lens 207 is shown in the drawing) illustrated in FIGS. 2A and 2B. The irradiation with the linearized laser light is made by scanning the laser light.

The important thing, in any case, is that the effective energy intensity ratio ($I_0'/I_0$) between a primary laser light 1805, which passes through the cylindrical lens 207 to be used to irradiate the front side of the amorphous semiconductor film 1803, and a secondary laser light 1806, which passes through the amorphous semiconductor film 1803 and is reflected once at the reflective member 1804 to be used to irradiated the back side of the amorphous semiconductor film 1803, satisfies the relation of $0 < I_0'/I_0 < 1$, or $1 < I_0'/I_0$. To achieve this, the reflectance of the reflective member 1804 to the laser light is preferably 20 to 80%. At this point, some of the measures for attenuating the effective energy intensity of the secondary laser light, which have been mentioned above in this embodiment, may be combined to obtain the desired intensity ratio.

The laser light passes through the cylindrical lens 207 to have an angle of incident of 45 to 90° with respect to the front side of the substrate during the process of being condensed. For that reason, the secondary laser light 1806 reaches further to the back side of the amorphous semiconductor film 1803 so as to irradiate there. The secondary laser light 1806 may be obtained more efficiently by forming an uneven portion on the reflective surface of the reflective member 1804 to diffuse the laser light.

An appropriate laser light is the one with its wavelength set within a wavelength range (around 530 nm) in which the light transmission component and the light absorption component with respect to the amorphous semiconductor film 1803 are sufficient. In this embodiment, the crystallization is made by the second harmonic (wavelength, 532 nm) of a YAG laser.

Using the second harmonic, a part of the irradiated light transmits through the amorphous semiconductor film and is reflected by the reflective member so that the back side of the amorphous semiconductor film is irradiated. Therefore, the secondary laser light 1806 can be obtained efficiently.

The obtained semiconductor film is next patterned to gain an island-like semiconductor film.

The rest of the steps are carried out in accordance with Embodiment 1 to obtain an active matrix substrate.

This embodiment may also be combined with Embodiment 2. If Embodiment 3 is used with this embodiment, then an active matrix type liquid crystal display device is obtained. Moreover, this embodiment may be applied to the semiconductor devices shown in Embodiments 4 and 5.

According to the present invention, improvement of the throughput from the laser annealing that uses a conventional excimer laser can be achieved by employing a solid state laser that is easy to maintain, as well as the throughput is improved by linearizing the laser light in laser annealing. This leads to reduction in production cost of a TFT and a semiconductor device formed from the TFT, such as a liquid crystal display device.

Moreover, to conduct laser annealing by irradiating both the front side and the back side of the amorphous semiconductor film with laser light makes it possible to obtain a crystalline semiconductor film with a larger crystal grain size as compared to prior art (where only the front side of the amorphous semiconductor film is irradiated with laser light). The obtainment of the crystalline semiconductor film with a larger crystal grain size further can lead to a great improvement of the ability of a semiconductor device.

What is claimed is:

1. A method for manufacturing a semiconductor device comprising the steps of:
    forming a semiconductor film over an insulating film;
    irradiating a front side of the semiconductor film with a laser light generated from a solid state laser;
    reflecting the laser light by a reflective member provided below the insulating film;
    irradiating a back side of the semiconductor film with the laser light reflected by the reflected member;
    forming an active region comprising a source region, a drain region, and a channel region using the semiconductor film; and
    wherein a substrate is interposed between the reflective member and the insulating film.

2. A method for manufacturing a semiconductor device according to claim 1, wherein reflective member comprises at least one selected from the group consisting of aluminum, silver, tungsten, titanium, and tantalum.

3. A method for manufacturing a semiconductor device according to claim 1, wherein the insulating film comprises silicon.

4. A method for manufacturing a semiconductor device according to claim 1, wherein the solid state laser is selected from the group consisting of YAG laser, $YVO_4$ laser, and $YAIO_3$ laser.

5. A method for manufacturing a semiconductor device according to claim 1, wherein the laser light is continuous wave laser beam.

6. A method for manufacturing a semiconductor device according to claim 1, wherein the semiconductor film comprises one of amorphous silicon and an amorphous silicon germanium.

7. A method for manufacturing a semiconductor device comprising the steps of:
    forming a semiconductor film over an insulating film;
    irradiating a front side of the semiconductor film with a laser light generated from a solid state laser;
    reflecting the laser light transmitted through the semiconductor film by a reflective member provided below the insulating film;
    irradiating a back side of the semiconductor film with the laser light reflected by the reflected member; and
    forming an active region comprising a source region, a drain region, and a channel region using the semiconductor film; and
    wherein a substrate is interposed between the reflective member and the insulating film.

8. A method for manufacturing a semiconductor device according to claim 7, wherein reflective member comprises at least one selected from the group consisting of aluminum, silver, tungsten, titanium, and tantalum.

9. A method for manufacturing a semiconductor device according to claim 7, wherein the insulating film comprises silicon.

10. A method for manufacturing a semiconductor device according to claim 7, wherein the solid state laser is selected from the group consisting of YAG laser, YVO$_4$ laser, and YAlO$_3$ laser.

11. A method for manufacturing a semiconductor device according to claim 7, wherein the laser light is continuous wave laser beam.

12. A method for manufacturing a semiconductor device according to claim 7, wherein the semiconductor film comprises one of amorphous silicon and an amorphous silicon germanium.

13. A method for manufacturing a semiconductor device comprising the steps of:
forming a semiconductor film over an insulating film;
irradiating a front side of the semiconductor film with a laser light generated from a solid state laser with an angle of incident of 45° to 90° with respect to the front side of the substrate;
reflecting the laser light by a reflective member provided below the insulating film;
irradiating a back side of the semiconductor film with the laser light reflected by the reflected member; and
forming an active region comprising a source region, a drain region, and a channel region using the semiconductor film; and
wherein a substrate is interposed between the reflective member and the insulating film.

14. A method for manufacturing a semiconductor device according to claim 13, wherein reflective member comprises at least one selected from the group consisting of aluminum, silver, tungsten, titanium, and tantalum.

15. A method for manufacturing a semiconductor device according to claim 13, wherein the insulating film comprises silicon.

16. A method for manufacturing a semiconductor device according to claim 13, wherein the solid state laser is selected from the group consisting of YAG laser, YVO$_4$ laser, and YAlO$_3$ laser.

17. A method for manufacturing a semiconductor device according to claim 13, wherein the laser light is continuous wave laser beam.

18. A method for manufacturing a semiconductor device according to claim 13, wherein the semiconductor film comprises one of amorphous silicon and an amorphous silicon germanium.

19. A method for manufacturing a semiconductor device comprising the steps of:
forming a semiconductor film over an insulating film;
irradiating a front side of the semiconductor film with a laser light generated from a solid state laser;
reflecting the laser light by a reflective member provided below the insulating film;
irradiating a back side of the semiconductor film with the laser light reflected by the reflected member;
patterning the semiconductor film to form an island-like semiconductor film;
forming a gate insulating film over the island-like semiconductor film;
forming a gate electrode over the gate insulating film; and
wherein a substrate is interposed between the reflective member and the insulating film.

20. A method for manufacturing a semiconductor device according to claim 19, wherein reflective member comprises at least one selected from the group consisting of aluminum, silver, tungsten, titanium, and tantalum.

21. A method for manufacturing a semiconductor device according to claim 19, wherein the insulating film comprises silicon.

22. A method for manufacturing a semiconductor device according to claim 19, wherein the solid state laser is selected from the group consisting of YAG laser, YVO$_4$ laser, and YAlO$_3$ laser.

23. A method for manufacturing a semiconductor device according to claim, wherein the laser light is continuous wave laser beam.

24. A method for manufacturing a semiconductor device according to claim 19, wherein the semiconductor film comprises one of amorphous silicon and an amorphous silicon germanium.

25. A method for manufacturing a semiconductor device comprising the steps of:
forming a semiconductor film over an insulating film;
irradiating a front side of the semiconductor film with a laser light generated from a solid state laser;
reflecting the laser light transmitted through the semiconductor film by a reflective member provided below the insulating film;
irradiating a back side of the semiconductor film with the laser light reflected by the reflected member;
patterning the semiconductor film to form an island-like semiconductor film;
forming a gate insulating film over the island-like semiconductor film;
forming a gate electrode over the gate insulating film; and
wherein a substrate is interposed between the reflective member and the insulating film.

26. A method for manufacturing a semiconductor device according to claim 25, wherein reflective member comprises at least one selected from the group consisting of aluminum, silver, tungsten, titanium, and tantalum.

27. A method for manufacturing a semiconductor device according to claim 25, wherein the insulating film comprises silicon.

28. A method for manufacturing a semiconductor device according to claim 25, wherein the solid state laser is selected from the group consisting of YAG laser, YVO$_4$ laser, and YAlO$_3$ laser.

29. A method for manufacturing a semiconductor device according to claim 5, wherein the laser light is continuous wave laser beam.

30. A method for manufacturing a semiconductor device according to claim 25, wherein the semiconductor film comprises one of amorphous silicon and an amorphous silicon germanium.

31. A method for manufacturing a semiconductor device comprising the steps of:
forming a semiconductor film over an insulating film;
irradiating a front side of the semiconductor film with a laser light generated from a solid state laser with an angle of incident of 45 to 90° with respect to the front side of the substrate;
reflecting the laser light by a reflective member provided below the insulating film;
irradiating a back side of the semiconductor film with the laser light reflected by the reflected member;

patterning the semiconductor film to form an island-like semiconductor film;

forming a gate insulating film over the island-like semiconductor film;

forming a gate electrode over the gate insulating film; and wherein a substrate is interposed between the reflective member and the insulating film.

32. A method for manufacturing a semiconductor device according to claim 31, wherein reflective member comprises at least one selected from the group consisting of aluminum, silver, tungsten, titanium, and tantalum.

33. A method for manufacturing a semiconductor device according to claim 31, wherein the insulating film comprises silicon.

34. A method for manufacturing a semiconductor device according to claim 31, wherein the solid state laser is selected from the group consisting of YAG laser, $YVO_4$ laser, and $YAlO_3$ laser.

35. A method for manufacturing a semiconductor device according to claim 31, wherein the laser light is continuous wave laser beam.

36. A method for manufacturing a semiconductor device according to claim 31, wherein the semiconductor film comprises one of amorphous silicon and an amorphous silicon germanium.

* * * * *